United States Patent
Lim et al.

(10) Patent No.: US 8,836,020 B2
(45) Date of Patent: Sep. 16, 2014

(54) VERTICAL NONVOLATILE MEMORY DEVICES HAVING REFERENCE FEATURES

(75) Inventors: Ju-young Lim, Seoul (KR);
Woon-kyung Lee, Seongnam-si (KR);
Jae-joo Shim, Suwon-si (KR);
Hui-chang Moon, Yongin-si (KR);
Sung-min Hwang, Seoul (KR)

(73) Assignee: Samsung Electronics Co., Ld. (KR)

(*) Notice: Subject to any disclaimer, the term of this patent is extended or adjusted under 35 U.S.C. 154(b) by 165 days.

(21) Appl. No.: 13/285,291

(22) Filed: Oct. 31, 2011

(65) Prior Publication Data
US 2012/0193705 A1  Aug. 2, 2012

(30) Foreign Application Priority Data

Feb. 1, 2011  (KR) .................. 10-2011-0010306

(51) Int. Cl.
| | |
|---|---|
| *H01L 27/108* | (2006.01) |
| *G11C 5/02* | (2006.01) |
| *G11C 5/06* | (2006.01) |
| *H01L 27/115* | (2006.01) |
| *G11C 16/04* | (2006.01) |

(52) U.S. Cl.
CPC ............ *G11C 16/0483* (2013.01); *G11C 5/025* (2013.01); *G11C 5/063* (2013.01); *H01L 27/11556* (2013.01)
USPC ........................................ 257/330

(58) Field of Classification Search
CPC ................... H01L 29/66545; H01L 29/66606
USPC ......................................... 257/330, E29.262
See application file for complete search history.

(56) References Cited

U.S. PATENT DOCUMENTS

| | | | | |
|---|---|---|---|---|
| 7,114,251 | B2* | 10/2006 | Mashino | 29/852 |
| 2002/0058381 | A1* | 5/2002 | Lee | 438/259 |
| 2003/0038330 | A1 | 2/2003 | Obara | |

FOREIGN PATENT DOCUMENTS

| | | |
|---|---|---|
| JP | 11-044664 | 2/1999 |
| KR | P1998-078285 | 11/1998 |
| KR | 1020030019095 | 3/2003 |
| KR | 1020080001895 | 1/2008 |

* cited by examiner

*Primary Examiner* — Amar Movva
(74) *Attorney, Agent, or Firm* — Myers Bigel Sibley & Sajovec, P.A.

(57) ABSTRACT

A memory device includes a substrate having a cell array region defined therein. A dummy structure is disposed on or in the substrate near a boundary of the cell array region. The memory device also includes a vertical channel region disposed on the substrate in the cell array region. The memory device further includes a plurality of vertically stacked conductive gate lines with insulating layers interposed therebetween, the conductive gate lines and interposed insulating layers disposed laterally adjacent the vertical channel region and extending across the dummy structure, at least an uppermost one of the conductive gate lines and insulating layers having a surface variation at the crossing of the dummy structure configured to serve as a reference feature. The dummy structure may include a trench, and the surface variation may include an indentation overlying the trench.

15 Claims, 14 Drawing Sheets

VERTICAL NONVOLATILE MEMORY DEVICES HAVING REFERENCE FEATURES

CROSS-REFERENCE TO RELATED APPLICATIONS

This application claims the benefit of Korean Patent Application No. 10-2011-0010306, filed on Feb. 1, 2011, in the Korean Intellectual Property Office, the disclosure of which is incorporated herein in its entirety by reference.

BACKGROUND

The inventive subject matter relates to nonvolatile memory devices and methods of fabricating the same, and more particularly, to vertical nonvolatile memory devices and methods of fabricating the same.

There is an ongoing demand for electronic products to be smaller and process more data. Accordingly, there is a corresponding demand increase the degree of integration of semiconductor memory devices used in such electronic products. One technique for increasing the degree of integration degree of nonvolatile semiconductor memory devices is to employ a vertical transistor structure, instead of the traditional two-dimensional transistor structure.

SUMMARY

According to some embodiments of the inventive subject matter, a memory device includes a substrate and a dummy structure disposed on or in the substrate near a boundary of a connection region of the substrate. The memory device also includes a vertical channel region disposed on the substrate in a cell array region of the substrate. The memory device further includes a plurality of vertically stacked conductive gate lines with insulating layers interposed therebetween, the conductive gate lines and interposed insulating layers disposed laterally adjacent the vertical channel region and extending across the dummy structure, at least an uppermost one of the conductive gate lines and insulating layers having a surface variation at the crossing of the dummy structure configured to serve as a reference feature. The dummy structure may include a trench, and the surface variation may include an indentation overlying the trench.

In further embodiments, terminations of the conductive gate lines are stepped. The memory device may further include a second dummy structure disposed near an edge of the connection region opposite the cell array region. The second dummy structure may include a dummy trench, a dummy resistor or a dummy gate structure.

Further embodiments provide methods including forming a dummy structure on or in a substrate near an boundary of a connection region and forming a plurality of vertically stacked conductive layers with insulating layers interposed therebetween on the substrate and covering the dummy structure so as to form a surface variation in at least an uppermost one of the stacked conductive layers and insulating layers. The stacked conductive layers and insulating layers are patterned using the surface variation as a reference to form a plurality of vertically stacked conductive gate lines and insulating layers interposed therebetween. The dummy structure may include a trench and the surface variation may include an indentation. Patterning the stacked conductive layers and insulating layers using the surface variation as a reference to form a plurality of vertically stacked conductive gate lines and insulating layers interposed therebetween may include forming stepped terminations of the conductive gate lines in the connection region using the surface variation as a reference. A memory cell string may be formed, the memory cell string comprising a channel region extending vertically from the substrate and controlled by the plurality of conductive gate lines.

According to an aspect of the inventive subject matter, there is provided a vertical nonvolatile memory device including: a substrate on which a cell array region is defined; a dummy pattern that is located at an edge of the cell array region; and a plurality of conductive lines that are vertically stacked on the substrate to cover the dummy pattern and extend in at least one extension direction that varies on the dummy pattern such that a position of the dummy pattern is indicated.

The plurality of conductive lines may extend in a first direction, and the extension direction varies on the dummy pattern to a predetermined direction between the first direction and a second direction perpendicular to the substrate.

The plurality of conductive lines may include a bent portion, which is bent toward the second direction, on the dummy pattern.

The bent portion may include a recessed portion having a center that is the same as a center of the dummy pattern.

The dummy pattern may extend in a third direction perpendicular to the first direction and the second direction.

The dummy pattern may be a trench for measurement that is formed in the substrate and act as a reference point for measuring positions of terminal portions of the plurality of conductive lines.

The vertical nonvolatile memory device may further include a connection region that is located outside the cell array region and a peripheral circuit region that is located outside the connection region, both the connection region and the peripheral circuit region being defined on the substrate, wherein circuits for driving a cell array are disposed in the peripheral circuit region, and the plurality of conductive lines are connected to the circuits of the peripheral circuit region by wiring lines in the connection region.

The connection region may include a plurality of stepped portions that are formed by making terminal portions of the conductive lines which are lower lines extend longer than terminal portions of the conductive lines which are upper lines, wherein the plurality of stepped portions expose portions of the conductive lines by predetermined lengths.

The vertical nonvolatile memory device may further include contact plugs that are formed in the portions of the conductive lines exposed by the plurality of stepped portions and connect the conductive lines to peripheral circuits.

When the dummy pattern is a first dummy pattern, the vertical nonvolatile memory device may further include at least one second dummy pattern that is formed in the connection region adjacent to the peripheral circuit region and acts as a reference point for measuring locations of terminal portions of the conductive lines.

The at least one second dummy pattern may have the same structure as a structure formed in the peripheral circuit region.

The first dummy pattern and the second dummy pattern may be electrically isolated.

The vertical nonvolatile memory device may further include a plurality of channel regions that vertically extend in the cell array region, wherein a plurality of memory cell strings that each include a plurality of memory cells and at least one select transistor located at one side of the plurality of memory cells and are adjacent to one another vertically extend on the substrate along outer walls of the plurality of channel regions.

The plurality of conductive lines may be gate lines of the plurality of memory cells and the at least one select transistor.

According to another aspect of the inventive subject matter, there is provided a vertical nonvolatile memory device including: a substrate; a plurality of conductive lines that are vertically stacked on the substrate, extend in one direction, and have terminal portions formed in a downward stepwise manner; and at least one dummy pattern that is formed on the substrate in the vicinity of the terminal portions and is electrically isolated.

BRIEF DESCRIPTION OF THE DRAWINGS

Exemplary embodiments of the inventive subject matter will be more clearly understood from the following detailed description taken in conjunction with the accompanying drawings in which.

DETAILED DESCRIPTION

Figure 1:
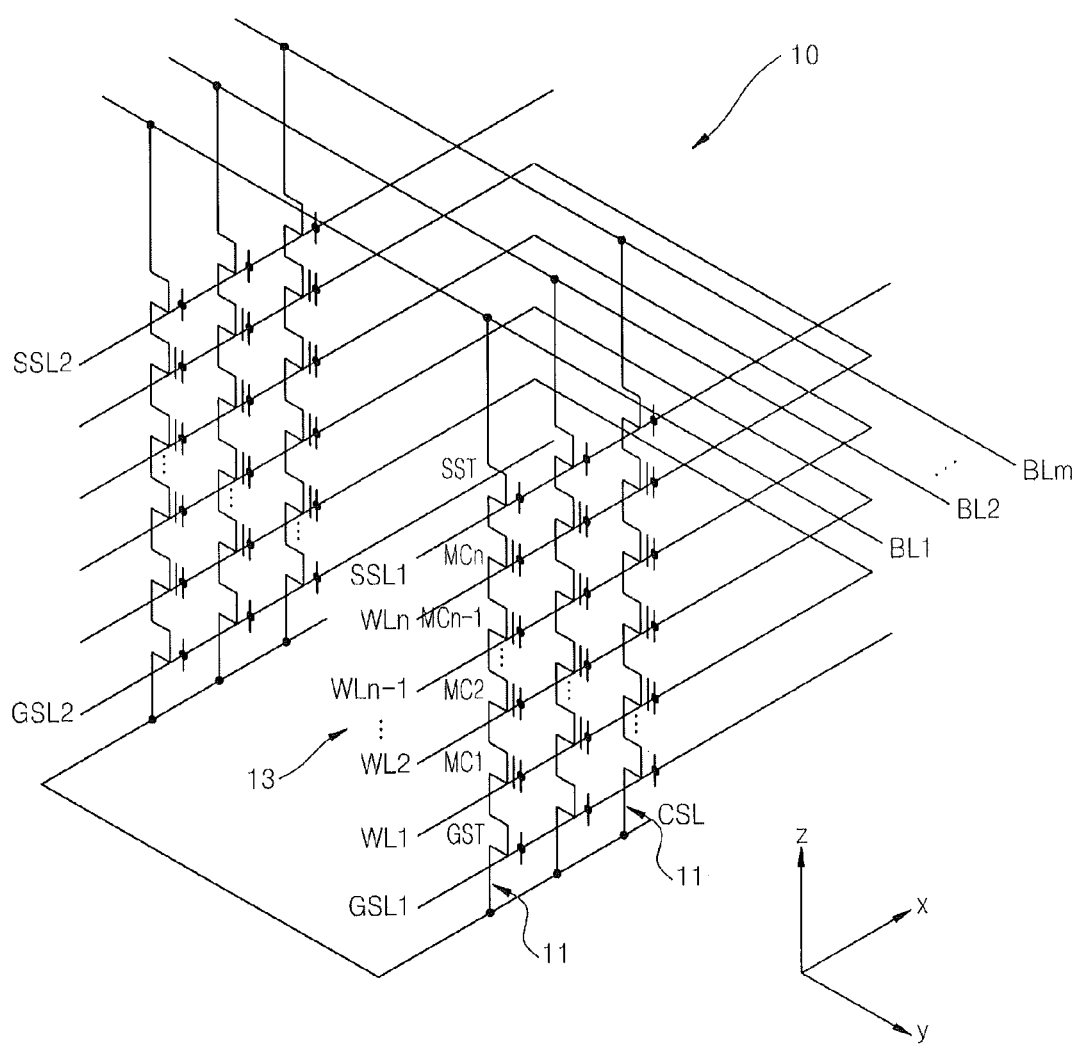
FIG. 1 is an equivalent circuit diagram of a memory cell array of a nonvolatile memory device according to some embodiments of the inventive subject matter.

The inventive subject matter will now be described more fully with reference to the accompanying drawings, in which exemplary embodiments of the inventive subject matter are shown. The inventive subject matter may, however, be embodied in many different forms and should not be construed as being limited to the embodiments set forth herein; rather these embodiments are provided so that this disclosure will be thorough and complete, and will fully convey the concept of the inventive subject matter to one of ordinary skill in the art.

Variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, like reference numerals denote like features. Furthermore, the regions illustrated in the figures are schematic in nature and their shapes may be not intended to illustrate the actual shape of a region of a device and are not intended to limit the scope of exemplary embodiments.

FIG. 1 is an equivalent circuit diagram of a memory cell array 10 of a nonvolatile memory device according to some embodiments of the inventive subject matter. In FIG. 1, an equivalent circuit diagram of a vertical NAND flash memory device having a vertical channel structure is illustrated.

Referring to FIG. 1, the memory cell array 10 may include a plurality of memory cell strings 11. Each of the plurality of memory cell strings 11 may have a vertical structure that extends in a vertical direction (that is, a z direction) perpendicular to directions (that is, x and y directions) in which a main surface of a substrate (not shown) extends (referred to as extension directions hereinafter). The plurality of memory cell strings 11 may constitute a memory cell block 13.

Each of the plurality of memory cell strings 11 may include a plurality of memory cells MC1 through MCn, a string selection transistor SST, and a ground selection transistor GST. In each of the memory cell strings 11, the ground selection transistor GST, the plurality of memory cells MC1 through MCn, and the string selection transistor SST may be arranged in series in the vertical direction (that is, the z direction). The plurality of memory cells MC1 through MCn may store data. A plurality of word lines WL1 through WLn may be respectively coupled to the memory cells MC1 through MCn to control the memory cells MC1 through MCn. The number of the plurality of memory cells MC1 through MCn may be appropriately determined according to a capacity of the nonvolatile memory device.

A plurality of bit lines BL1 through BLm which extend in the y direction may be connected to first ends of the memory cell strings 11 arranged in first through mth columns of the memory cell block 13, for example, to a drain side of the string selection transistor SST. Also, a common source line CSL may be connected to other ends of the memory cell strings 11, for example, to a source side of the ground selection transistor GST.

The word lines WL1 through WLn which extend in the x direction may be commonly connected to gates of the memory cells MC1 through MCn of the plurality of memory cell strings 11. Data may be programmed, read, or erased in the plurality of memory cells MC1 through MCN as the word lines WL1 through WLn are driven.

The string selection transistor SST in each of the memory cell strings 11 may be disposed between the bit lines BL1 through BLm and the memory cells MC1 through MCn. In the memory cell block 13, each string selection transistor SST may control data, transmission between the plurality of bit lines BL1 through BLm and the plurality of memory cells MC1 through MCn responsive to a string selection line SSL connected to a gate of the string selection transistor SST.

The ground selection transistor GST may be disposed between the plurality of memory cells MC1 through MCn and the common source line CSL. In the memory cell block 13, each ground selection transistor GST may control data transmission between the plurality of memory cells MC1 through MCn and the common source line CSL responsive to a ground selection line GSL connected to a gate of the ground selection transistor GST.

Figure 2:
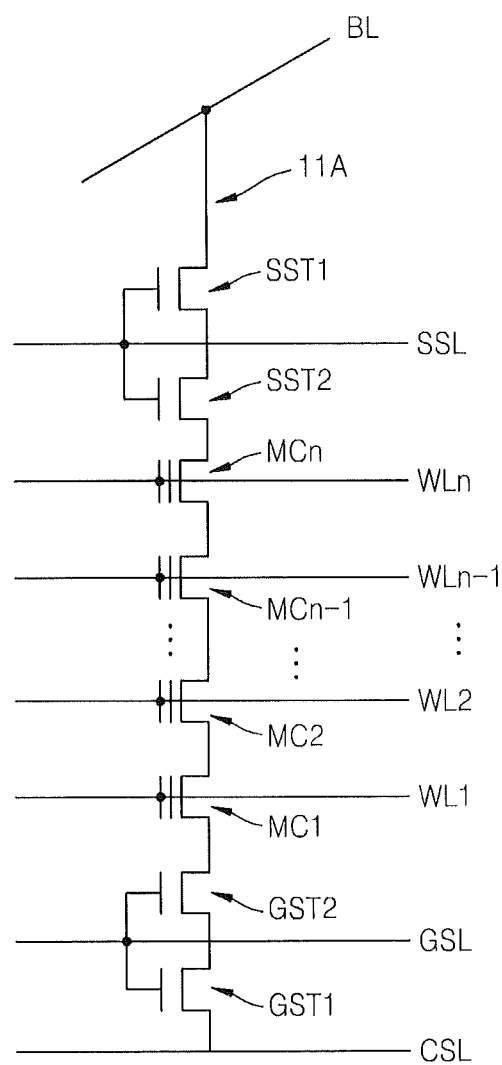
FIG. 2 is an equivalent circuit diagram of a memory cell string of a nonvolatile memory device according to some embodiments of the inventive subject matter.

FIG. 2 is an equivalent circuit diagram of a memory cell string of a nonvolatile memory device according to some embodiments of the inventive subject matter. In FIG. 2, an equivalent circuit diagram of one memory cell string 11A included in a vertical NAND flash memory device having a vertical channel structure is illustrated. In FIGS. 1 and 2, like features are denoted by the same reference numerals, and thus a detailed explanation thereof in reference to FIG. 2 will not be given in light of the foregoing description with reference to FIG. 1.

In FIG. 1, the string selection transistor SST is a single transistor. However, in FIG. 2, two string selection transistors SST1 and SST2 are arranged in series between a bit line BL and the memory cells MC1 through MCn. The string selection line SSL may be commonly connected to gates of the string selection transistors SST1 and SST2. The string selection line SSL may be one of a plurality of string selection lines in a block of memory cells, similar to the first string selection line SSL1 and the second string selection line SSL2 of FIG. 1.

Also, in FIG. 1, the ground selection transistor GST is a single transistor. However, in FIG. 2, two ground selection transistors GST1 and GST2 are arranged in series between the plurality of memory cells MC1 through MCn and the common source line CSL. The ground selection line GSL may be commonly connected to gates of the ground selection transistors GST1 and GST2. The ground selection line GSL may be one of a plurality of ground selection lines in a block of memory cells, similar to the first ground selection line GSL1 and the second ground selection line GSL2 of FIG. 1. Similarly, a bit line BL may correspond to any one of a plurality of bits lines of the memory cell block, similar to the bit lines BL1 through BLm of FIG. 1.

Figure 3:
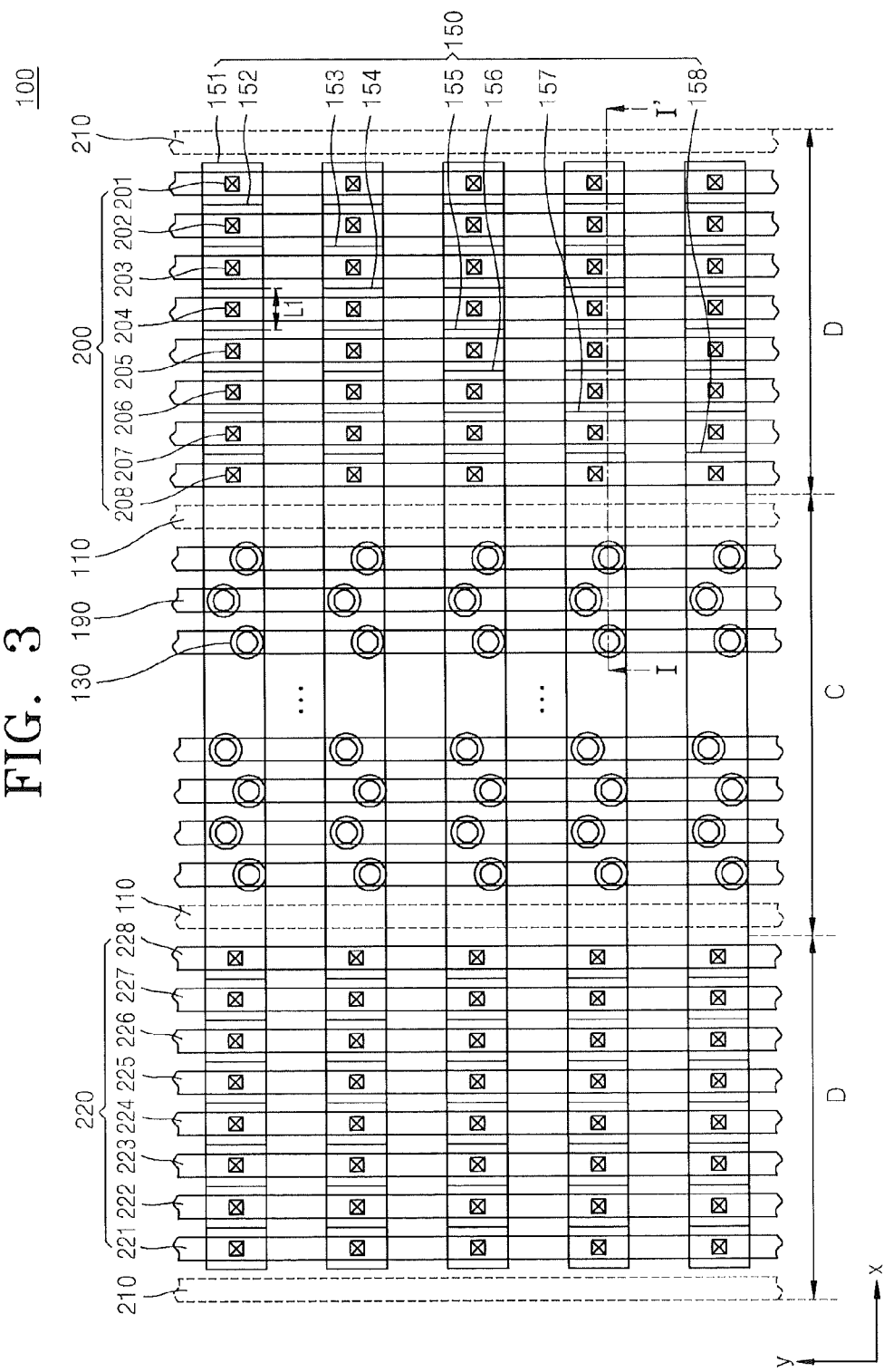
FIG. 3 is a plan view illustrating a structure of a nonvolatile memory device according to some embodiments of the inventive subject matter.

FIG. 3 is a plan view illustrating a structure of a nonvolatile memory device 100 according to some embodiments of the inventive subject matter. Referring to FIG. 3, the nonvolatile memory device 100 may include a cell array region C, a connection region D, and a peripheral circuit region (not shown) outside the connection region D.

A plurality of memory cells, bit lines 190 electrically connected to the memory cells, and gate lines 151 through 158 (collectively denoted by 150) are disposed in the cell array region C. Because the gate lines 150 include a conductive material, the gate lines 150 may be referred to as conductive lines. The gate lines 150 may extend in an x direction, and the bit lines 190 may extend in a y direction that is perpendicular to the x direction. A plurality of channel regions 130 may be disposed in a zigzag fashion in the cell array region C, and the channel regions 130 are electrically connected to the bit lines 190. In the cell array region C adjacent to the connection region D, a first dummy trench 110 may extend in parallel with the bit lines 190.

The connection region D is formed between the cell array region C and the peripheral circuit region (not shown). The gate lines 150 extend from the cell array region C into the connection region D, and the gate lines 150 extend such that an extension length of a given one of the gate lines 150 is shorter by a predetermined length L1 than an extension length of a next lower gate line 150, from a lowermost layer 151 to an uppermost layer 158 in a stepped fashion. A wiring structure for electrically connecting the gate lines 150 and the peripheral circuit region may include integrated word lines 221 through 228 (collectively denoted by 220) and contact plugs 201 through 208 (collectively denoted by 200). At a side of the connection region D opposite to a side of the connection region D contacting the cell array region C, a second dummy trench 210 may be formed on an edge of the connection region D, extending in parallel with the first dummy trench 110.

The peripheral circuit region is disposed outside the connection region D. In the peripheral circuit region, circuits for driving the memory cells and circuits for reading information stored in the memory cells may be disposed.

The nonvolatile memory device 100 includes one or more dummy trenches, that is, the first and second dummy trenches 110 and 210, which are disposed in the cell array region C adjacent to the connection region D and/or in the connection region D adjacent to the peripheral circuit region. The first and second dummy trenches 110 and 210 may be used for measurement. Accordingly, when terminal portions of the gate lines 150 extending to different lengths are formed, positions of the terminal portions may be accurately controlled by measuring distances using the first and second dummy trenches 110 and 210 as reference points. Also, the gate lines 150 may be subsequently connected to the contact plugs 200 without poor contact.

Figure 4:
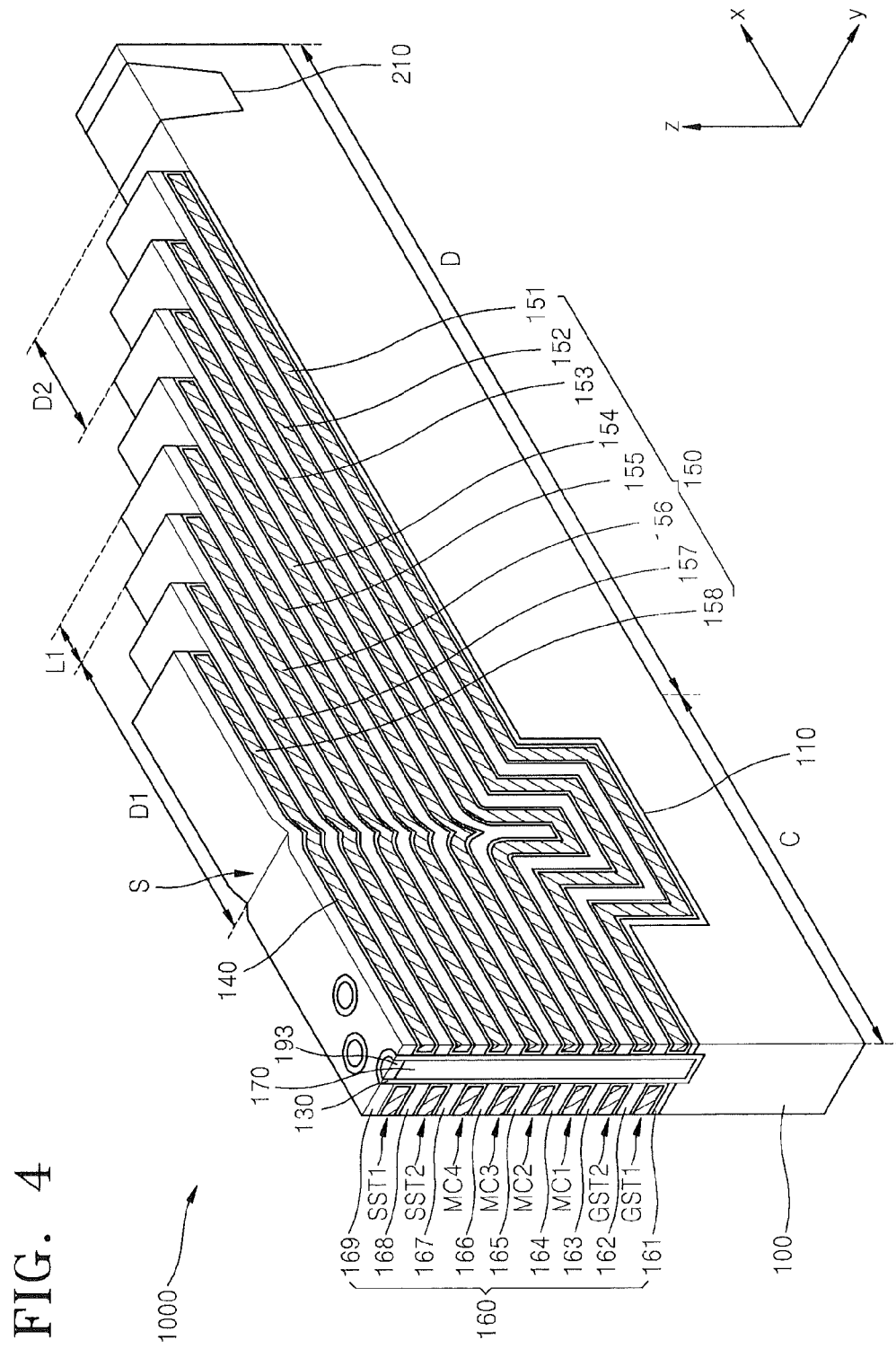
FIG. 4 is a perspective view illustrating a structure of a nonvolatile memory device according to a first embodiment of the inventive subject matter.

FIG. 4 is a perspective view illustrating a structure of a nonvolatile memory device 1000 according to some embodiments of the inventive subject matter, illustrating a portion corresponding to line I-I' of FIG. 3. In FIG. 4, some components constituting the memory cell string of FIG. 2 may not be shown. For example, the bit line of the memory cell string is not shown.

Referring to FIG. 4, the nonvolatile memory device 1000 includes the cell array region C and the connection region D. The cell array region C includes the channel regions 130 disposed on the substrate 100 and a plurality of memory cell strings disposed along sidewalls of the channel regions 130. The plurality of memory cell strings may be arranged in an x direction along circumferences of the channel regions 130 that are disposed in the x direction. Memory cell strings, similar to the string 11A of FIG. 2 may extend in a z direction from the substrate 100 along the sidewalls of the channel region 130. Each of the memory cell strings may include two ground selection transistors GST1 and GST2, a plurality of memory cells MC1, MC2, MC3, and MC4, and two string selection transistors SST1 and SST2, as shown in FIG. 2.

The substrate 100 may have a main surface that extends in the x direction and a y direction. The substrate 10 may include a semiconductor material, for example, a group IV semiconductor, a group III-V compound semiconductor, or a group II-VI oxide semiconductor. For example, the group IV semiconductor may include silicon, germanium, or silicon-germanium. The substrate 100 may be provided as a bulk wafer or an epitaxial layer.

The first dummy trench 110 may be formed in the substrate 100 in the cell array region C adjacent to the connection region D. The first dummy trench 110 may extend in the y direction. The first dummy trench 110 may have a predetermined distance of, for example, 10 micrometers (μm) or less from at least one of terminal portions of the gate lines 150, in order to facilitate measurement and improve measurement reliability when positions of the terminations of the gate lines 150 are measured by using the first dummy trench 110 as a reference point.

On the first dummy trench 110, the gate lines 150 may be indented over the first dummy trench 110. In particular, of the gate lines 150 may be indented generally in the z direction toward the substrate 110 over the first dummy trench 110.

In FIG. 4, an indentation S in an uppermost insulating layer 169 may have a curved shape and may point toward the first dummy trench 110. The indentation S may be formed at a position substantially aligned with a center of the first dummy trench 110. The indentation S may have a predetermined depth so as to be recognized as a reference point when being measured in a plane.

The first dummy trench 110 of FIG. 4 is an example of a pattern for measuring positions of the terminal positions of the gate lines 150, but the inventive subject matter is not limited to use of a trench to form a measurement feature. For example, in some embodiments, a dummy pattern may be formed on a top surface of the substrate 100, causing formation of convex bumps in the gate lines 150.

The channel regions 130 having pillar shapes may be disposed on the substrate 100 and may extend therefrom in the z direction. The channel regions 130 may be spaced apart from one another in the x direction and the y direction, and may be disposed in a zigzag fashion in the x direction. That is, the channel regions 130 arranged adjacent to one another in the x direction may be disposed to be offset in the y direction. Also, although the channel regions 130 are offset in two columns in FIG. 4, the inventive subject matter is not limited thereto. For example, the channel regions 130 may be disposed in a zigzag fashion to be offset in three or more columns. The channel regions 130 may be formed in, for example, annular shapes. The channel regions 130 may be electrically connected to the substrate 100 such that bottom surfaces of the channel regions 130 directly contact the substrate 100. The channel regions 130 may include a semiconductor material, such as polysilicon or single crystal silicon. The semiconductor material may be undoped or may include a p-type or an n-type impurity. Buried insulating layers 170 may be respectively formed in the channel regions 130.

Insulating regions (not shown) may be formed on both side surfaces of the channel regions 130 in the y direction. Under the insulating regions, impurity regions (not shown) may be arranged adjacent to the main surface of the substrate 100 to extend in the x direction and to be spaced apart from one another in the y direction. Respective impurity regions may be disposed between pairs of adjacent channel regions of the channel regions 130 in the y direction. The impurity regions may be source regions, and may form PN junction with other regions of the substrate 100. The common source line CSL of FIGS. 1 and 2 may be connected to the impurity regions (not shown).

Conductive layers 193 may be formed on top surfaces of the buried insulating layers 170 and may be electrically connected to the channel regions 130. The conductive layers 193 may include, for example, doped polysilicon. The conductive layers 193 may act as drain regions of the string selection transistors SST1 and SST2.

The first string selection transistors SST1 arranged in the y direction may be commonly connected to the bit line BL (see FIG. 2) through the conductive layers 193. The bit line (not shown) may have a pattern having a line shape extending in the y direction, and may be electrically connected through bit line contact plugs (not shown) formed in the conductive layers 193. Also, the first ground selection transistors GST1 arranged in the y direction may be electrically connected to the impurity regions (not shown) adjacent to the first ground selection transistors GST1.

The plurality of gate lines 150 may be arranged along side surfaces of the channel regions 130 to be spaced apart from the substrate 100 in the z direction. The gate lines 150 may be gates of the ground selection transistors GST1 and GST2, the plurality of memory cells MC1, MC2, MC3, and MC4, and the string selection transistors SST1 and SST2. The gate lines 150 may be commonly connected to adjacent memory cell strings arranged in the x direction. The gate lines 157 and 158 of the string selection transistors SST1 and SST2 may be connected to a string selection line SSL (see FIG. 2). The gate lines 153, 154, 155, and 156 of the memory cells MC1, MC2, MC3, and MC4 may be connected to respective word lines, like the word lines WL1 through WLn of FIG. 2. The gate lines 151 and 152 of the ground selection transistors GST1 and GST2 may be connected to the ground selection line GSL (see FIG. 2). The gate lines 150 may include a metal film, for example, tungsten (W). Also, although not shown in FIG. 4, the gate lines 150 may further include a diffusion barrier layer (not shown), and the diffusion barrier layer may include any one selected from the group consisting of, for example, tungsten nitride (WN), tantalum nitride (TaN), and titanium nitride (TiN).

Gate dielectric films 140 may be disposed between the channel regions 130 and the gate lines 150. Although not shown in FIG. 4, each of the gate dielectric films 140 may include a tunneling insulating layer, a charge storage layer, and a blocking insulating layer which are sequentially stacked from the channel regions 130.

The tunneling insulating layer may tunnel charges to the charge storage layer through Fowler-Nordheim (F-N) tunneling. The tunneling insulating layer may include, for example, a silicon oxide. The charge storage layer may be a charge trapping layer or a floating gate conductive film. For example, the charge storage layer may include quantum dots or nanocrystals. The quantum dots or nanocrystals may include conductors, for example, fine particles of a semiconductor or a metal. The blocking insulating layer may include a high-k dielectric material. Here, the term high-k dielectric material refers to a dielectric material having a dielectric constant higher than that of an oxide film.

Respective ones of the interlayer insulating layers 160 may be disposed between adjacent pairs of the gate lines 150. The interlayer insulating layers 160 may be arranged to extend in the x direction and to be spaced apart in the z direction, like the gate lines 150. Side surfaces of the interlayer insulating layers 160 may contact the channel regions 130. The interlayer insulating layers 160 may include, for example, a silicon oxide or a silicon nitride.

Although four memory cells, that is, the memory cells MC1, MC2, MC3, and MC4, are shown in FIG. 4, the inventive subject matter is not limited thereto, and a greater or less number of memory cells may be arranged according to a capacity of the nonvolatile memory device 1000. Also, the string selection transistors SST1 and SST2 and the ground selection transistors GST1 and GST2 of the memory cell strings are arranged as pairs. Since the number of the string selection transistors SST1 and SST2 and the ground selection transistors GST1 and GST2 is two or more, a gate length in the z direction of the gate lines 151, 152, 157, and 158 may be much smaller than a gate length when the number of string selection transistors and ground selection transistors is one, thereby filling the interlayer insulating layers 160 without a void. However, the inventive subject matter is not limited thereto and, in some embodiments, each memory cell string may include one string selection transistor SST and one ground selection transistor GST as shown in FIG. 1. Also, the string selection transistor SST and the ground selection transistor GST may have structures different from those of the memory cells MC1, MC2, MC3, and MC4.

The connection region D is a region where the gate lines 150 and the interlayer insulating layers 160 extend, and includes stepped portions formed by the gate lines 150 and the interlayer insulating layers 160. The stepped portions may be formed such that the gate lines 150 and the interlayer insulating layers 160 which are upper layers are shorter by a predetermined length L1 than the gate lines 150 and the interlayer insulating layers 160 which are lower layers. The contact plugs 200 (see FIG. 3) for connecting the integrated word lines 220 (see FIG. 3) may be formed in the stepped portions.

The second dummy trench 210 is disposed on an outer edge of the connection region D. At a side of the connection region D opposite to a side of the connection region D contacting the cell array region C, the connection region D contacts a peripheral circuit region (not shown), and the second dummy trench 210 may be disposed adjacent to the peripheral circuit region. The second dummy trench 210 may be deeper than the first dummy trench 110, but the inventive subject matter is not limited thereto. In some embodiments, the second dummy trench 210 may be formed in a peripheral circuit region (not shown) adjacent to the connection region D. In any case, the second dummy trench 110 may have a predetermined distance of, for example, 10 µm or less, from at least one of the terminal portions of the gate lines 150, that is, from the stepped portions, in order to facilitate measurement and improve measurement reliability when positions of the terminal portions are measured by using the second dummy trench 210 as a reference point.

The peripheral circuit region (not shown) may be disposed outside the connection region D in the x direction. Although not shown in FIG. 4, components, such as a high voltage transistor, a low voltage transistor, and a resistor, may be formed in the peripheral circuit region.

In FIG. 4, when the stepped portions of the gate lines 150 are formed, a stepped portion length may be measured by using the first dummy trench 110 and the second dummy trench 210 as reference points. As for the gate lines 150 close to the recessed portion S formed by the first dummy trench 110, a distance D1 from the recessed portion S is measured by using the recessed portion S as a reference point. Also, as for the gate lines 150 close to the second dummy trench 210, a distance D2 from the second dummy trench 210 may be measured by using the second dummy trench 210 as a reference point. Accordingly, the stepped portions of the gate lines 150 may be accurately formed.

Figure 5A:
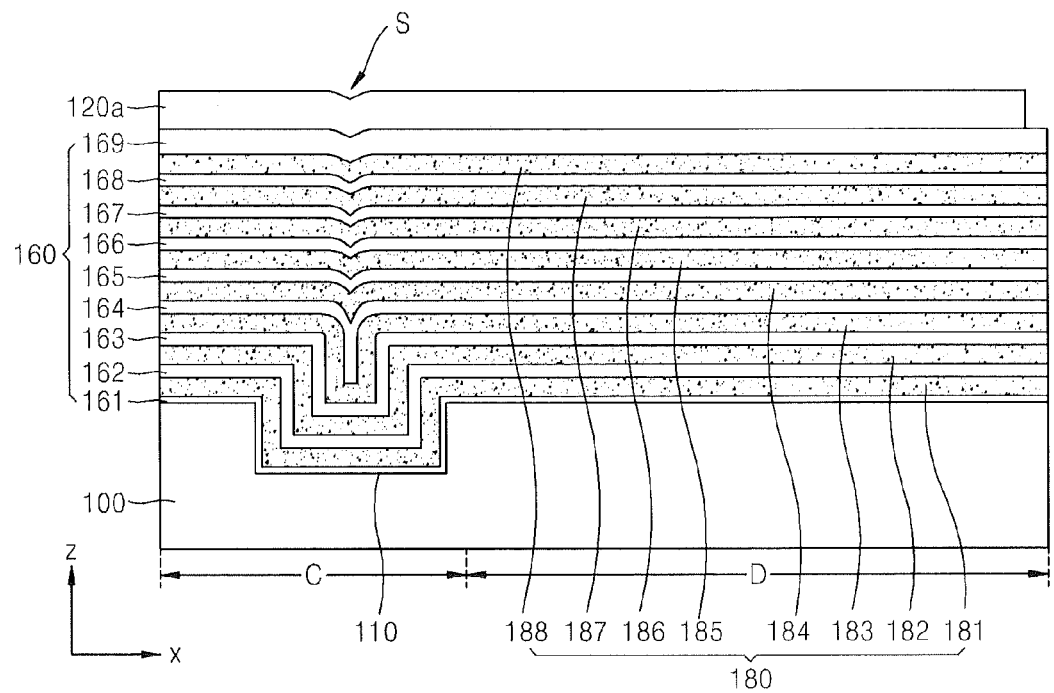
FIGS. 5A through 5I are cross-sectional views for explaining a method of manufacturing the nonvolatile memory device of FIG. 4, according to some embodiments of the inventive subject matter.

FIGS. 5A through 5I are cross-sectional views illustrating operations for manufacturing the nonvolatile memory device 1000 of FIG. 4, according to some embodiments of the inventive subject matter, seen in cross-section along the y direction of FIG. 4. Referring to FIG. 5A, the first dummy trench 110 is formed in the substrate 100. The first dummy trench 110 may be formed in the cell array region C adjacent to the connection region D. A depth, a width, and a shape of the first dummy trench 110 generally may vary according to a structure of the nonvolatile memory device 1000.

A plurality of interlayer sacrificial layers 181 through 188 (collectively denoted by 180) and the plurality of interlayer insulating layers 161 through 169 (collectively denoted by 160) are alternately formed on the substrate 100 on which the first dummy trench 110 is formed. The interlayer sacrificial layers 180 and the interlayer insulating layers 160 may be alternately stacked on the substrate 100 starting from the first interlayer insulating layer 161 as shown in FIG. 5A. Due to the first dummy trench 110, the interlayer sacrificial layers 180 and the interlayer insulating layers 160 are indented toward the first dummy trench 110, and a top indentation S is formed on the ninth interlayer insulating layer 169.

The interlayer sacrificial layers 180 may be formed of a material that may be selectively etched with respect to the interlayer insulating layers 160. That is, the interlayer sacrificial layers 180 may be formed of a material that may be etched with little or no etching of the interlayer insulating layers 160. Such etch selectivity may refer to a ratio of an etch rate at which the interlayer sacrificial layers 180 are etched to an etch rate at which the interlayer insulating layers 160 are etched. For example, the interlayer insulating layers 160 may be at least one of silicon oxide films and silicon nitride films, and the interlayer sacrificial layers 180 may be formed of a material which is different from that of the interlayer insulating layers 160 and selected from silicon films, silicon oxide films, silicon carbide films, and silicon nitride films.

As shown in 5A, thicknesses of the interlayer insulating layers 160 may not be the same. The first interlayer insulating layer 161, which is a lowermost layer, of the interlayer insulating layers 160 may have a relatively low thickness, while the ninth interlayer insulating layer 169, which is an uppermost layer, may have a relatively high thickness. However, thicknesses of the interlayer insulating layers 160 and the interlayer sacrificial layers 180 may be changed in various ways, and the number of films constituting the interlayer insulating layers 160 and the interlayer sacrificial layers 180 may also be changed in various ways.

A first mask layer 120a is formed on the interlayer insulating layers 160 and the interlayer sacrificial layers 180. The first mask layer 120a is a layer for cutting in the connection region D the interlayer insulating layers 160 and the interlayer sacrificial layers 180 extending from the cell array region C. The first mask layer 120a may include, for example, a photoresist. Optionally, the first mask layer 120a may be formed as a composite layer including a photosensitive material and a non-photosensitive material. The first mask layer 120a may be formed to extend to a position where the second interlayer insulating layer 162 and the first interlayer sacrificial layer 181 extend. Alternatively, the first mask layer 120 may be formed to extend to a position where the first interlayer insulating layer 161, the second interlayer insulating layer 162, and the first interlayer sacrificial layer 181 extend. A position where the first mask layer 120a is formed may be clearly known by measuring a distance from the indentation S formed by the first dummy trench 110.

Figure 5B:
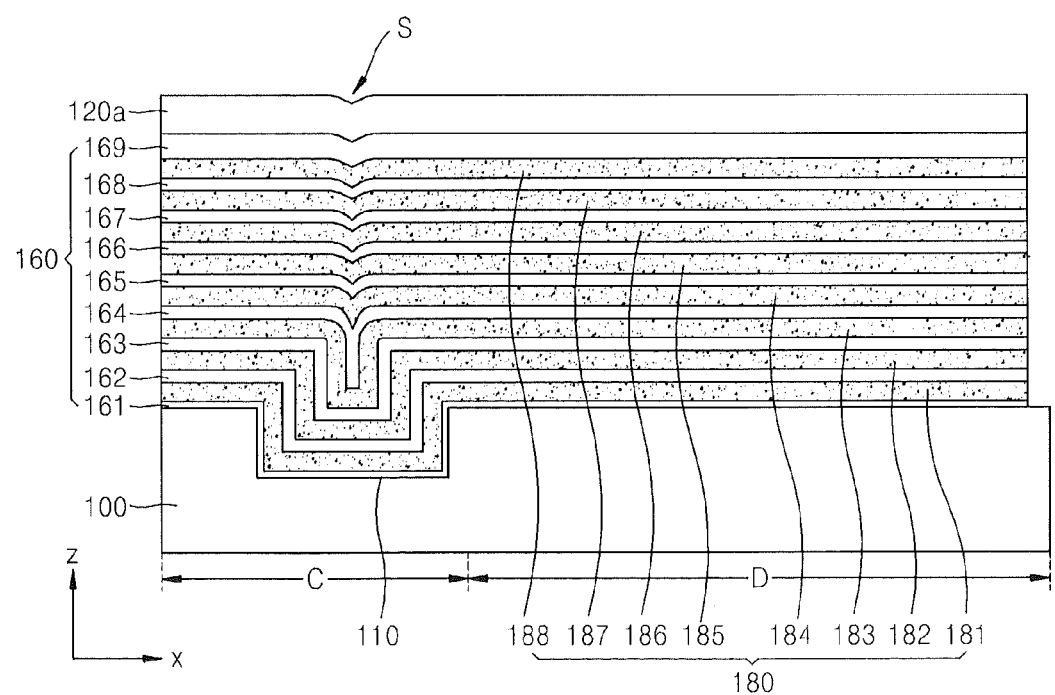

Referring to FIG. 5B, a process of etching and removing portions of the interlayer insulating layers 160 and the interlayer sacrificial layers 180 exposed by the first mask layer 120a is performed. The etching and removal process may be performed by anisotropic etching using dry etching or wet etching. If dry etching is used, the etching and removal process may be performed with a plurality of steps for sequentially etching portions of the interlayer insulating layers 160 and the interlayer sacrificial layers 180 which are stacked.

Figure 5C:
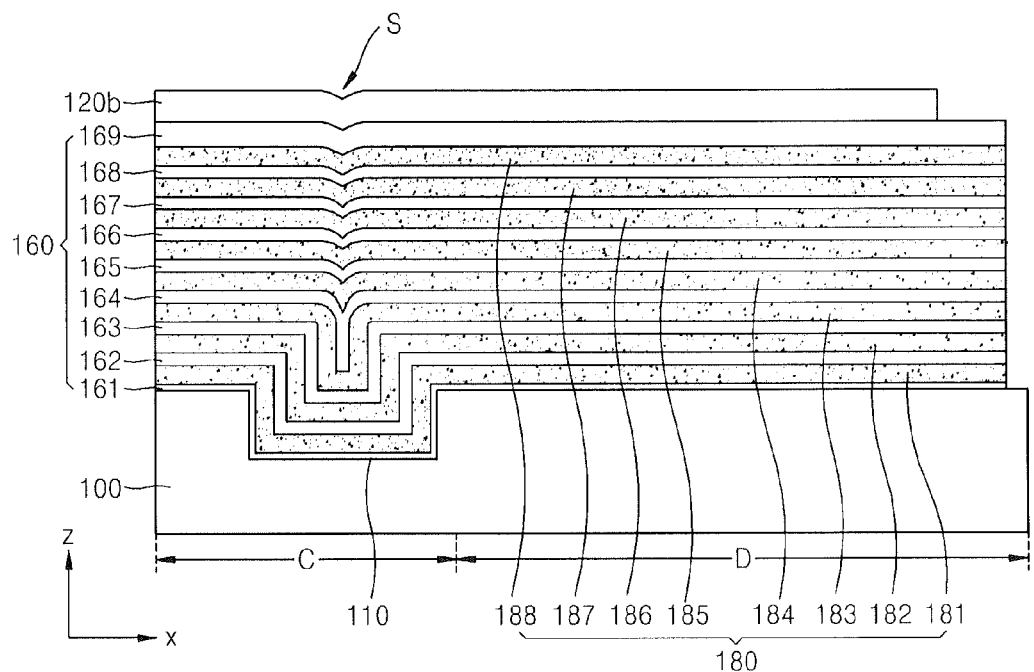

Referring to FIG. 5C, a process of trimming the first mask layer 120a of FIG. 5B may be performed. The trimming process may be performed by using dry etching or wet etching. Due to the trimming process, an edge of the first mask layer 120a is removed to form a second mask layer 120b that covers a reduced area. Due to the trimming process, a height of the first mask layer 120a may be reduced. The second mask layer 120b may be formed to extend to a position where the third interlayer insulating layer 163 and the second interlayer sacrificial layer 182 extend. A position where the second mask layer 120b is formed may be clearly known by measuring a distance from the indentation S formed by the first dummy trench 110.

Figure 5D:
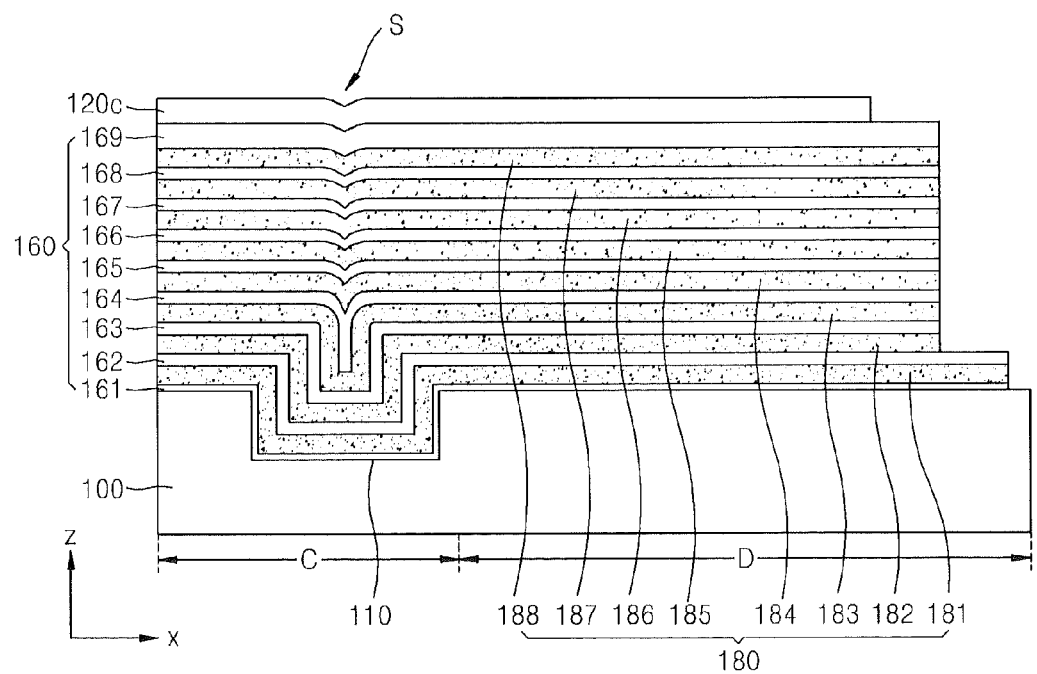

Referring to FIG. 5D, a process of etching and removing portions of the interlayer insulating layers 160 and the interlayer sacrificial layers 180 in the same manner as that used in FIG. 5B by using the second mask layer 120b of FIG. 5C is performed. The etching and removal process may be performed also on up to the second interlayer sacrificial layer 182.

Next, a trimming process is performed on the second mask layer 120b in the same manner as that used in FIG. 5C. Accordingly, a third mask layer 120c that covers a reduced area is formed, and may be formed to extend to a position where the fourth interlayer insulating layer 164 and the third interlayer sacrificial layer 183 extend.

Figure 5E:
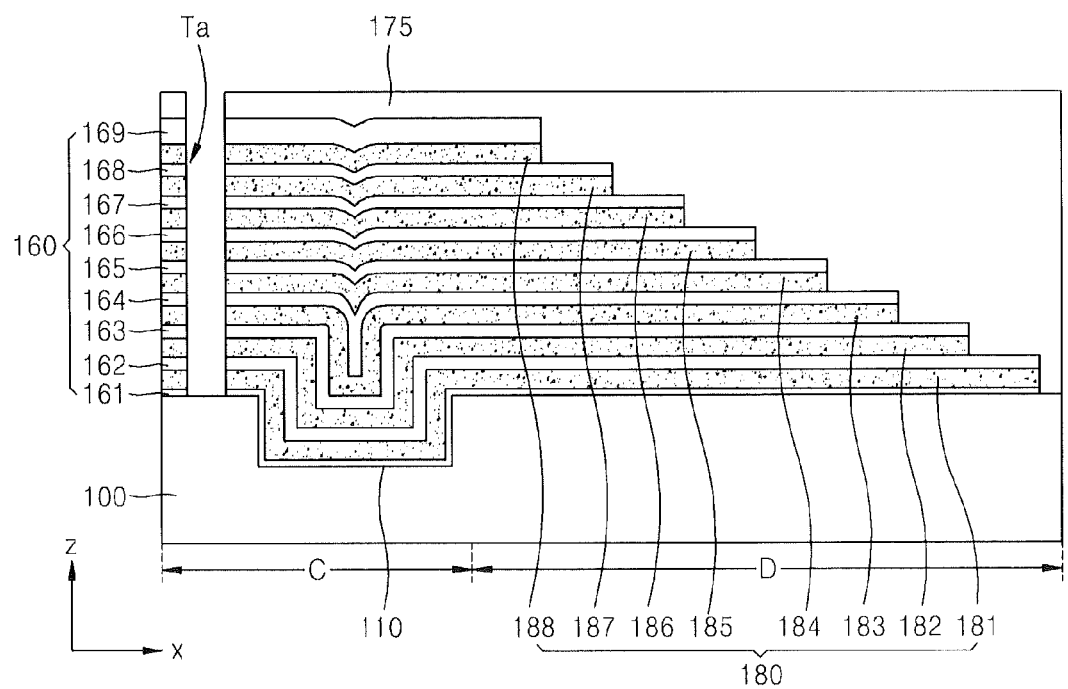

In the same manner as that described with reference to FIGS. 5B through 5D, a process of removing portions of the interlayer insulating layers 160 and the interlayer sacrificial layers 180 and a process of trimming the third mask layer 120c may be repeatedly performed. Using this process, the interlayer insulating layers 160 and the interlayer sacrificial layers 180 having stepped portions as shown in FIG. 5E are formed. The trimming process is a process of removing the mask layers 120a, 120b, and 120c by a predetermined length under given etching conditions. Accordingly, since the interlayer insulating layers 160 and the interlayer sacrificial layers 180 are repeatedly removed by the predetermined length by using the mask layers 120a, 120b, and 120c, positions of the stepped portions are relatively determined according to positions of lower layers. Accordingly, it may be difficult to control absolute positions of the stepped portions. According to some embodiments of the inventive subject matter, since each trimming process may be performed while measuring a distance from the indentation S, positions of the terminal portions of the gate lines 150 may be accurately controlled.

Referring to FIG. 5E, a connection region insulating layer 175 may be formed on the interlayer insulating layers 160 and the interlayer sacrificial layers 180 including the stepped portions. The connection region insulating layer 175 may include the same material as that of the interlayer insulating layers 160. After a peripheral circuit region (not shown) may be first formed, the cell array region C and the connection region D may be formed. In this case, since the connection region insulating layer 175 is formed and a planarization process is performed, heights of the cell array region C, the connection region D, and the peripheral circuit region may be the same.

Next, first openings Ta passing through the interlayer insulating layers 160 and the interlayer sacrificial layers 180 may be formed. The first openings Ta may be holes each having a depth in the z direction. Also, the first openings Ta may be spaced apart from one another in the x direction and the y direction (see FIG. 4).

Formation of the first openings Ta may include forming a predetermined mask pattern that defines positions of the first openings Ta in the interlayer insulating layers 160 and the interlayer sacrificial layers 180 and anisotropically etching the interlayer insulating layers 160 and the interlayer sacrificial layers 180 by using the predetermined mask pattern as an etch mask. Since a structure including two different types of films is etched, sidewalls of the plurality of first openings Ta may not be perpendicular to the top surface of the substrate 100. For example, widths of the first openings Ta may decrease toward the top surface of the substrate 100.

The first openings Ta may be formed to expose the top surface of the substrate 100 as shown in FIG. 5E. In addition, although not shown in FIG. 5E, as a result of over-etching in the anisotropic etching step, portions of the substrate 100 under the first openings Ta may be etched to a predetermined depth.

Figure 5F:
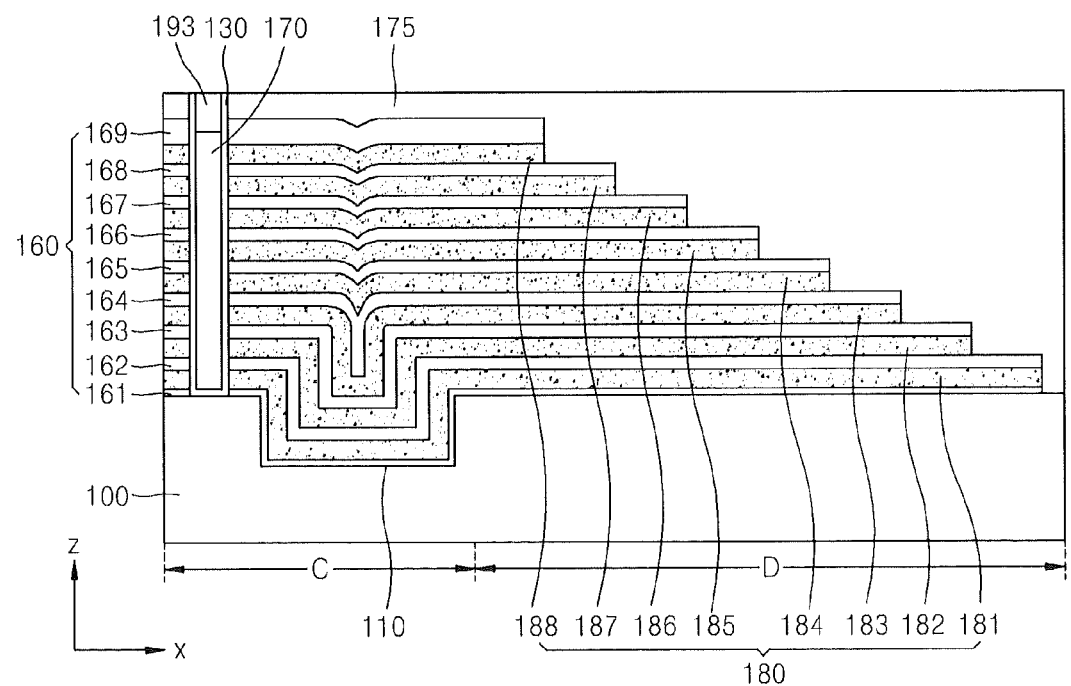

Referring to FIG. 5F, the channel regions 130 may be formed on inner walls and bottom surfaces of the first openings Ta. The channel regions 130 may be formed to have a predetermined thickness, for example, a thickness that is about 1/50 to 1/5 of widths of the first openings Ta, by using atomic layer deposition (ALD) or chemical vapor deposition (CVD). The channel regions 130 may be electrically connected to the substrate 100 by directly contacting the substrate 100 on the bottom surfaces of the first openings Ta.

Next, the first openings Ta may be filled with the buried insulating layers 170. Optionally, before the buried insulating layers 170 are formed, a hydrogen annealing step of thermally treating a structure including the channel regions 130 under a gas atmosphere including hydrogen or heavy hydrogen may be further performed. Due to the hydrogen annealing step, crystal defects existing in the channel regions 130 may be reduced.

A planarization process may remove an unnecessary semiconductor material and an unnecessary insulating material covering the connection region insulating layer 175. Upper portions of the buried insulating layers 170 may be partially removed by using an etching process or the like, and a material used to form the conductive layers 193 may be deposited on the removed portions. Again, a planarization process may be performed to form the conductive layers 193.

Figure 5G:
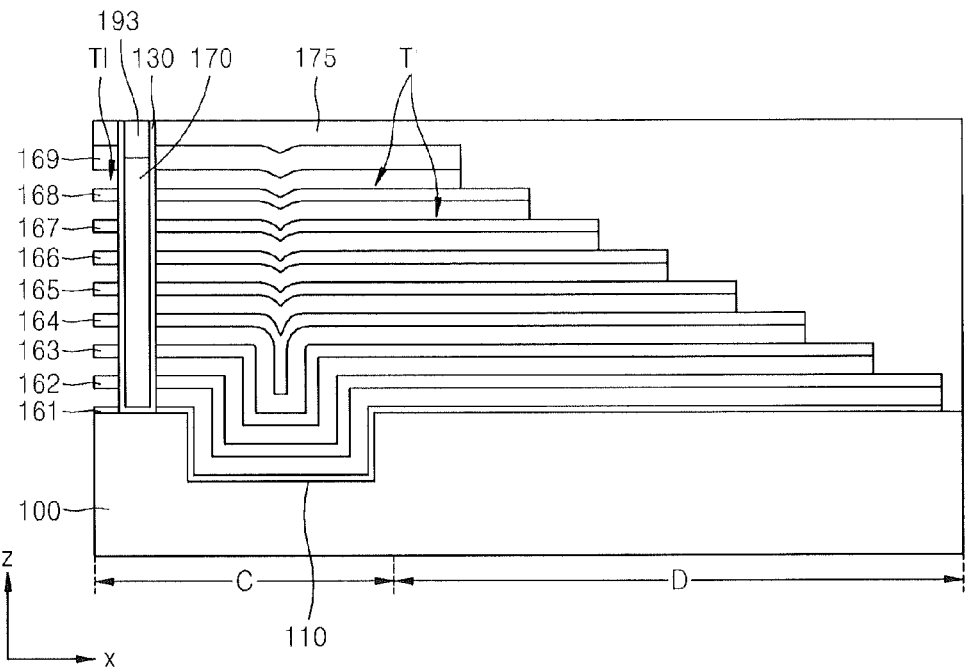

Referring to FIG. 5G, second openings (not shown) through which the substrate 100 is exposed are formed. Although not shown in FIG. 5G, the second openings may be formed between the channel regions 130 in the y direction (see FIG. 4), and may extend in the x direction.

Portions of the interlayer sacrificial layers 180 exposed through the second openings may be removed by using an etching process. Since the portions of the interlayer sacrificial layers 180 are removed, a plurality of side surface openings T1 defined between the interlayer insulating layers 160 may be formed. Sidewalls of the channel regions 130 may be partially exposed through the side surface openings T1.

Figure 5H:
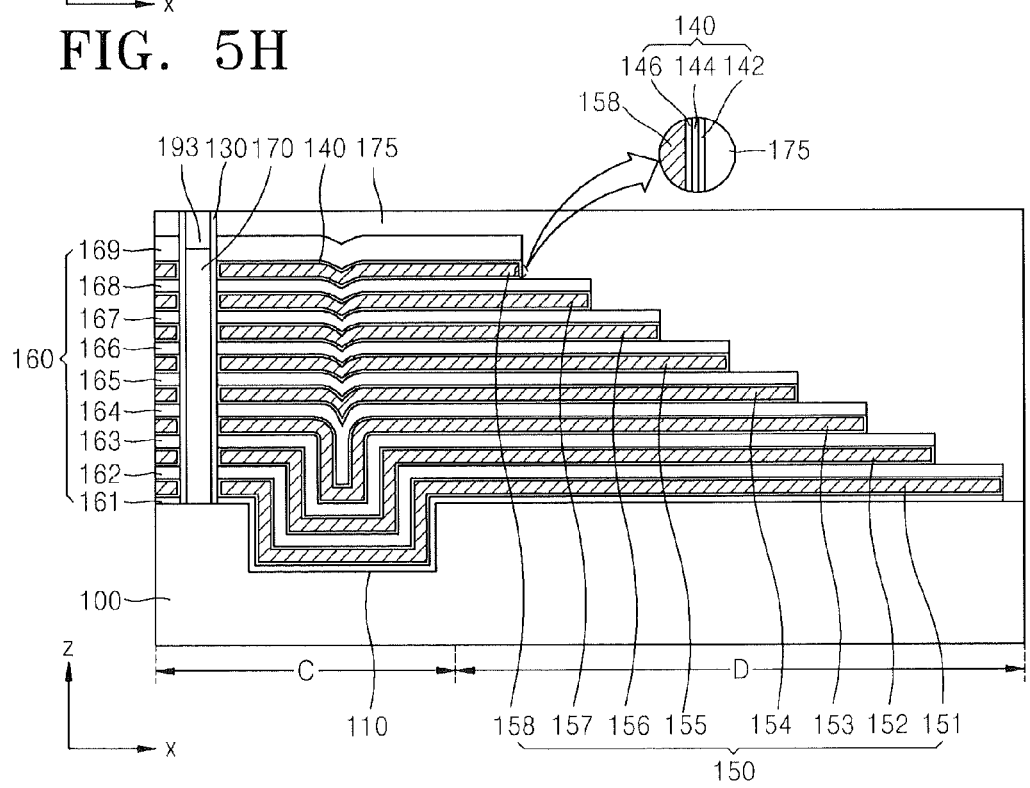

Referring to FIG. 5H, the gate dielectric films 140 may be formed on the portions of the channel regions 130 and the interlayer insulating layers 160 exposed through the second openings and the side surface openings T1. Each of the gate dielectric films 140 may include a tunneling insulating layer 142, a charge storage layer 144, and a blocking insulating layer 146 which are sequentially stacked from the channel regions 130. The tunneling insulating layer 142, the charge storage layer 144, and the blocking insulating layer 146 may be formed by using ALD, CVD or physical vapor deposition (PVD).

The second openings and the side surface openings T1 may be filled with a conductive material. The conductive material may be partially etched to form third openings (not shown). The third openings may be formed in the same shapes at the same positions as the second openings. Accordingly, since the conductive material is filled only in the side surface openings T1 of FIG. 5G, the gate lines 150 may be formed. Next, the third openings may be filled with an insulating material.

Figure 5I:
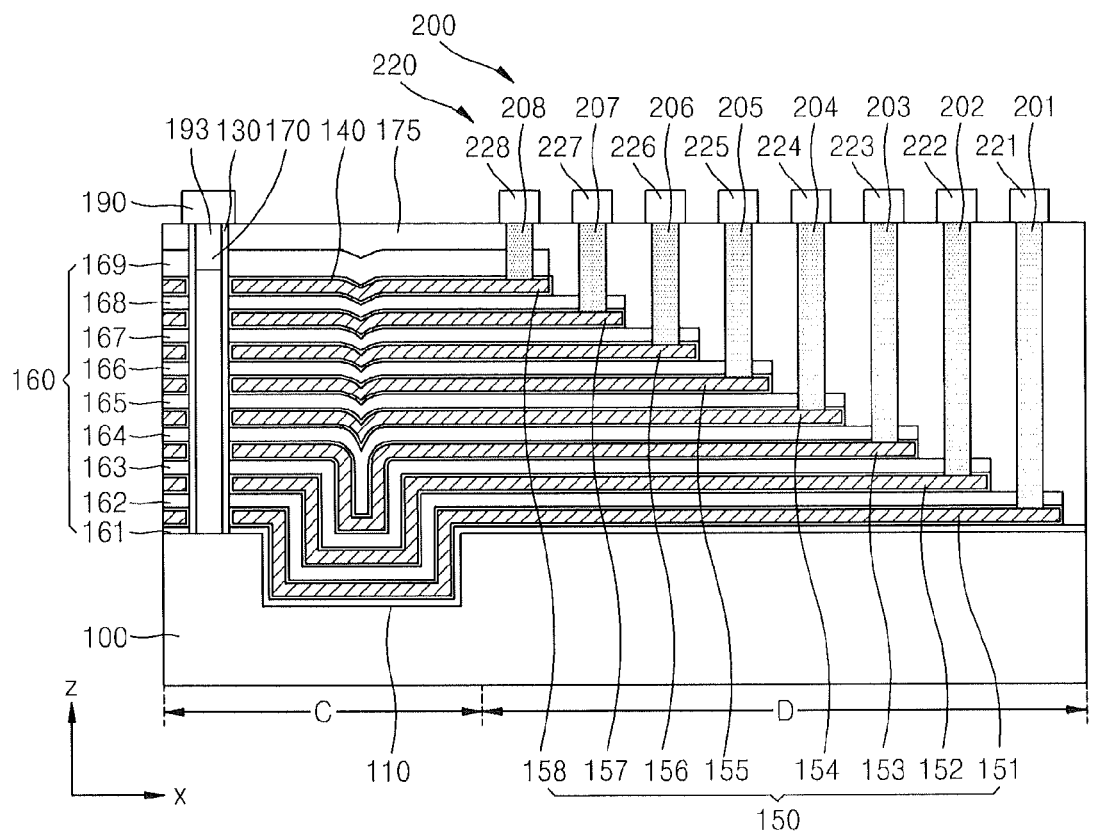

Referring to FIG. 5I, the bit lines 190 may be formed on the conductive layers 193. The conductive layers 193 may act as bit line contact plugs, and optionally, separate bit line contact plugs may be formed in the conductive layer 193. The bit lines 190 may extend in the y direction (see FIG. 4).

The contact plugs 200 electrically connected to the gate lines 150 are formed in the connection region D. The contact plugs 200 are formed to different depths to contact the gate lines 150. As depths of the contact plugs increase, that is, as bottom surfaces of the contact plugs 200 are closer toward the top surface of the substrate 100, widths of the contact plugs 200 at contact surfaces with the gate liens 150 may decrease. The integrated word lines 220 may be formed on the contact plugs 200. The integrated word lines 220 may be formed in parallel with the bit lines 190, and may connect the plurality of gate lines 150 of adjacent memory cell strings formed at the same height.

Figure 6A:
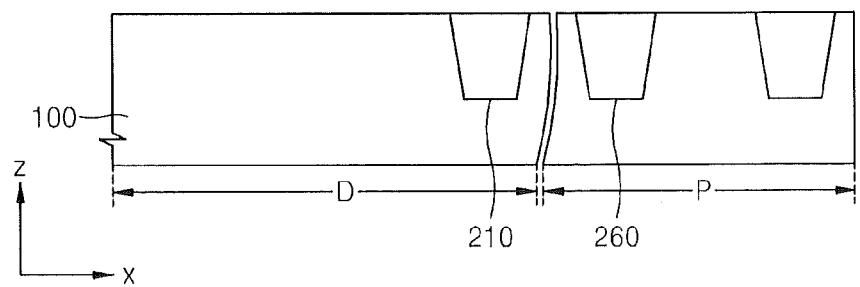
FIGS. 6A through 6C are cross-sectional views for explaining a method of manufacturing the nonvolatile memory device of FIG. 4, according to some embodiments of the inventive subject matter.
Figure 6B:
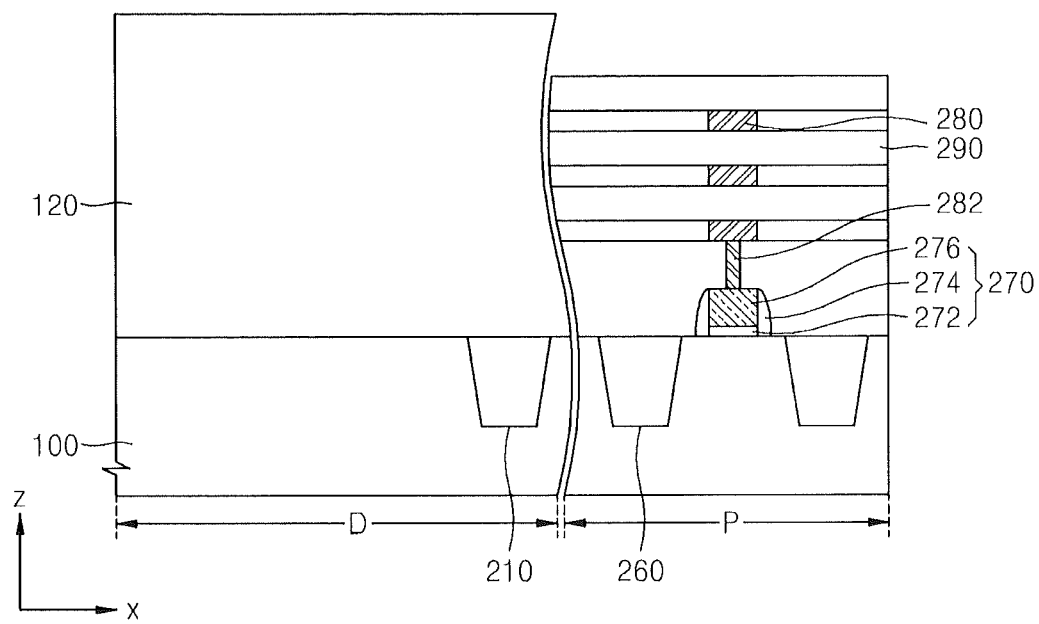
Figure 6C:
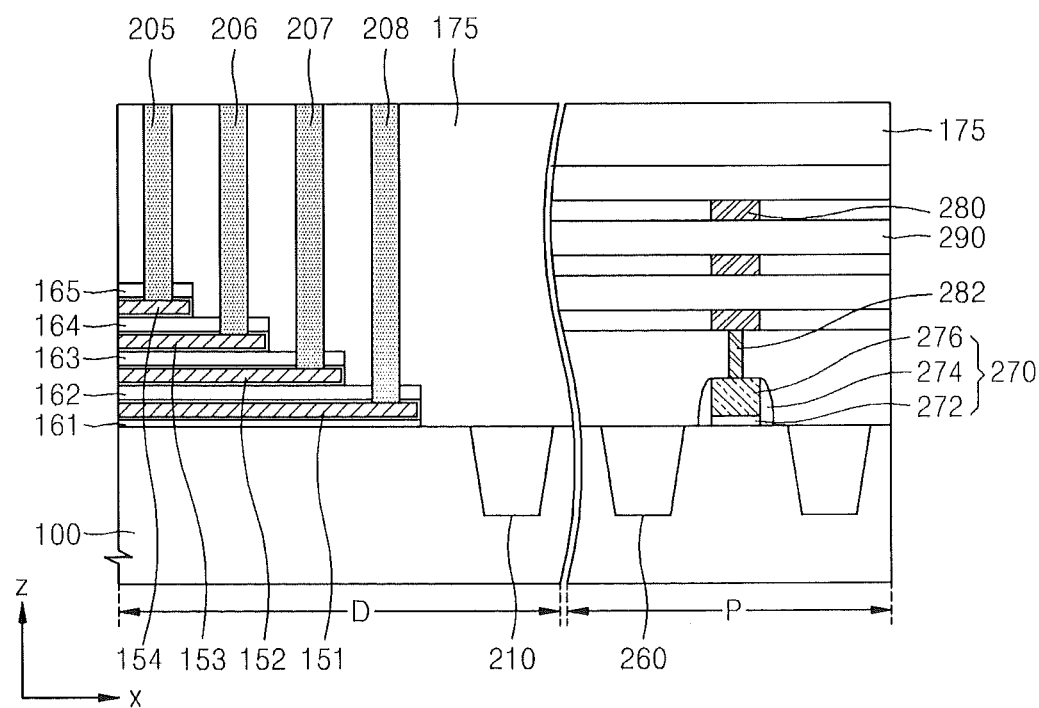

FIGS. 6A through 6C are cross-sectional views illustrating operations for manufacturing the nonvolatile memory device 1000 of FIG. 4 according to further embodiments of the inventive subject matter. FIGS. 6A through 6C are cross-sectional views, seen in the y direction of FIG. 4, illustrating operations for manufacturing the nonvolatile memory device 1000 in the peripheral circuit region P and the connection region D.

Referring to FIG. 6A, the second dummy trench 210 is formed in the connection region D of the substrate 100, and peripheral trenches 260 are formed in the peripheral circuit region P.

The second dummy trench 210 and the peripheral trenches 260 may be formed by forming a pad layer (not shown) and a mask layer (not shown) on the substrate 100, forming a photoresist pattern (not shown) through which portions where the second dummy trench 210 and the peripheral trenches 260 are to be formed are exposed, and etching the substrate 100. The trenches 210 and 260 may be formed by an anisotropic etching process, for example, a plasma etching process. After the second dummy trench 210 and the peripheral trenches 260 are formed, an ion injection process for improving insulating characteristics may be additionally performed.

An insulating material may be used to fill the second dummy trench 210 and the peripheral trenches 260. The insulating material may be formed using CVD, for example. The insulating material may be an oxide, a nitride, or a combination thereof. The insulating material may be, for example, a composite film including a buffer oxide film, a trench line nitride film, and a buried oxide film. Alternatively, the insulating material may be any one of high temperature oxide (HTO), high density plasma (HDP), tetra ethyl ortho silicate (TEOS), boron-phosphorous silicate glass (BPSG), and undoped silicate glass (USG). After the insulating material is formed, an annealing process for obtaining a film with high density may be additionally performed.

A planarization process, for example, chemical mechanical polishing (CMP), may be performed. The second dummy trench 210 and the peripheral trenches 260 filled with the insulating material may act as isolating films, and an active region of the substrate 100 may be defined by the isolating films.

In the illustrated embodiments, the second dummy trench 210 may be formed along with the peripheral trenches 260 in the same process. Accordingly, a separate process for forming the second dummy trench 210 that is one example of a dummy structure is not necessary. Also, since the second dummy trench 210 is formed closer to the connection region D than the peripheral trenches 260, measurement may be facilitated and a measurement error may be reduced.

Referring to FIG. 6B, as part of a process of forming components of the peripheral circuit region P, the mask layer 120 is formed in the connection region D and a cell array region (not shown) disposed at a side of the connection region D opposite to a side of the connection region D contacting the peripheral circuit region P.

Components, such as peripheral transistors 270, may be formed in the peripheral circuit region P. Each of the peripheral transistors 270 may include a peripheral gate insulating film 272, a peripheral gate spacer 274, and a peripheral gate electrode 276. In FIG. 6B, the peripheral transistors 270 are exemplary structures for representing semiconductor components formed in the peripheral circuit region P. Wiring structures, including peripheral contact plugs 282 and wires 280, may be formed between peripheral insulating layers 290.

Although the peripheral circuit region P is first formed and then components of the cell array region (not shown) and the connection region D are formed in FIG. 6B, embodiments of the inventive subject matter are not limited thereto. For example, after the second dummy trench 210 and the peripheral trenches 260 are formed, memory cell transistors may be first formed in the cell array region (not shown) and the connection region D.

Referring to FIG. 6C, as part of a process for forming components in the cell array region (not shown) and the connection region D, a mask layer (not shown) is formed in the peripheral circuit region P. Similar to the operations described with reference to FIGS. 5A through 5I, memory cell strings are formed in the cell array region (not shown) and the connection region D. In particular, during a gate line trimming process similar to that described above with reference to FIGS. 5A through 5D, positions of the mask layers 120a, 120b, and 120c may be accurately controlled by measuring distances from the second dummy trench 210. Similar to a process described above with reference to FIG. 5E, the connection region insulating layer 175 may be formed in the cell array region, the connection region D, and the peripheral circuit region P, and a planarization process may be performed.

Figure 7:
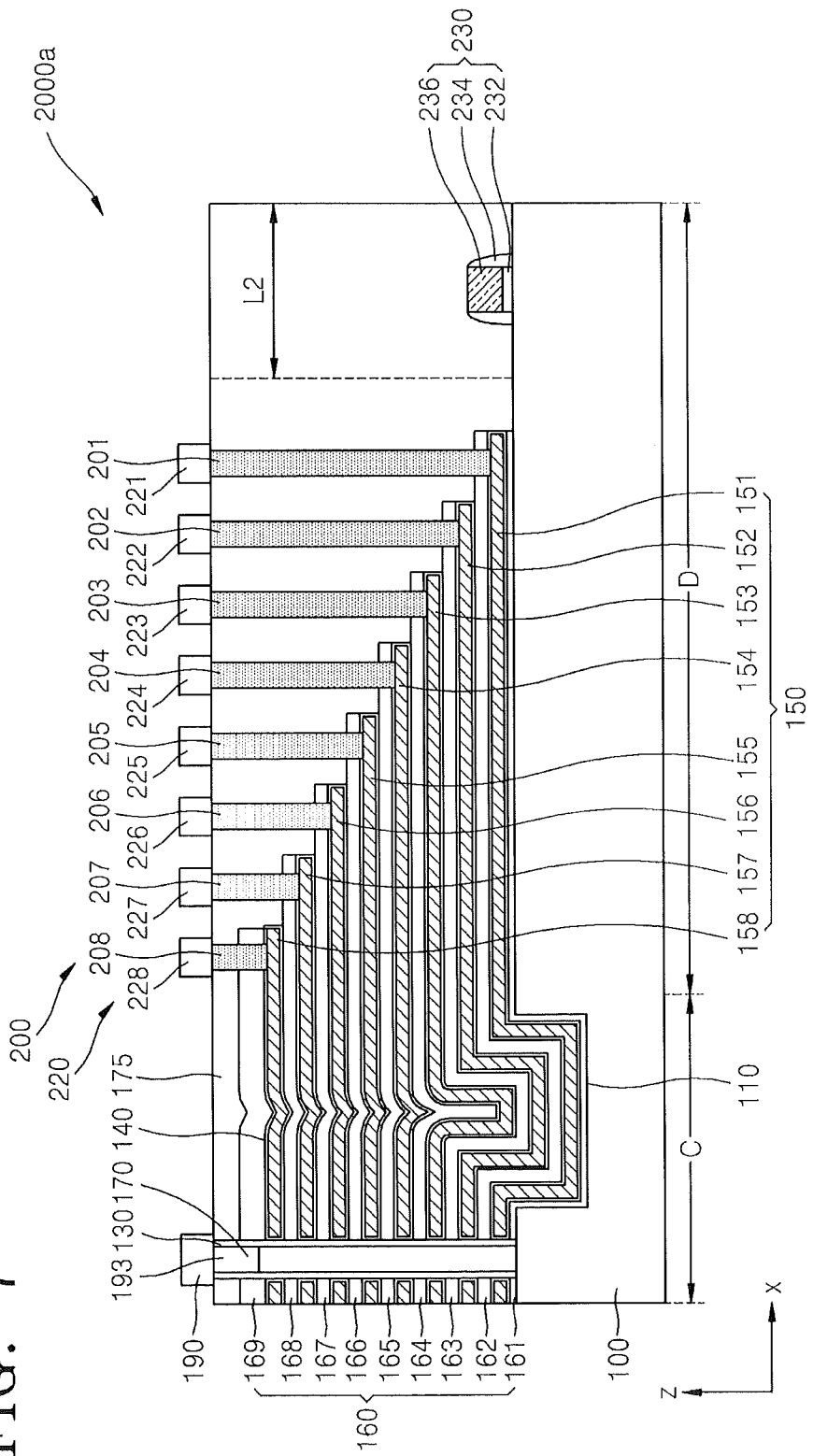
FIG. 7 is a cross-sectional view illustrating a structure of a nonvolatile memory device according to a additional embodiments of the inventive subject matter.

FIG. 7 is a cross-sectional view illustrating a structure of a nonvolatile memory device 2000a according to additional embodiments of the inventive subject matter. In FIG. 7, features like those illustrated in FIGS. 4 through 5I are denoted by like reference numerals, and thus a detailed explanation thereof will not be given in light of the foregoing description of these features. Referring to FIG. 7, the nonvolatile memory device 2000a includes a dummy gate 230 disposed on a side of the connection region D away from the cell array region C. The dummy gate 230 may include, for example, a gate insulating film 232, a gate spacer 234, and a gate electrode 236. Also, since the dummy gate 230 is formed for the purpose of measuring a distance, the dummy gate 230 may be formed to be electrically isolated.

The nonvolatile memory device 2000a may be formed by a process similar to the method of manufacturing the cell array region C, the connection region D, and the peripheral circuit region P described with reference to FIGS. 6A through 6C. That is, the dummy gate 230 instead of the second dummy trench 210 of FIGS. 6A through 6C may be formed along with the peripheral transistors 270. In this case, when the peripheral circuit region P described with reference to FIG. 6B is formed, the mask layer 120 formed in the connection region D is formed such that a region where the dummy gate 230 is formed is further exposed by a predetermined length L2.

In FIG. 7, since the dummy gate 230 is formed on an outer edge of the connection region D, the dummy gate 230 may be used as a reference point for position measurement when stepped portions of terminal portions of the gate lines 150 are formed. A separate process for forming the dummy gate 230 that is one example of a dummy structure is not necessary. Also, since the dummy gate 230 is formed closer to the connection region D than the components of the peripheral circuit region, measurement may be facilitated and a measurement error may be reduced.

Figure 8:
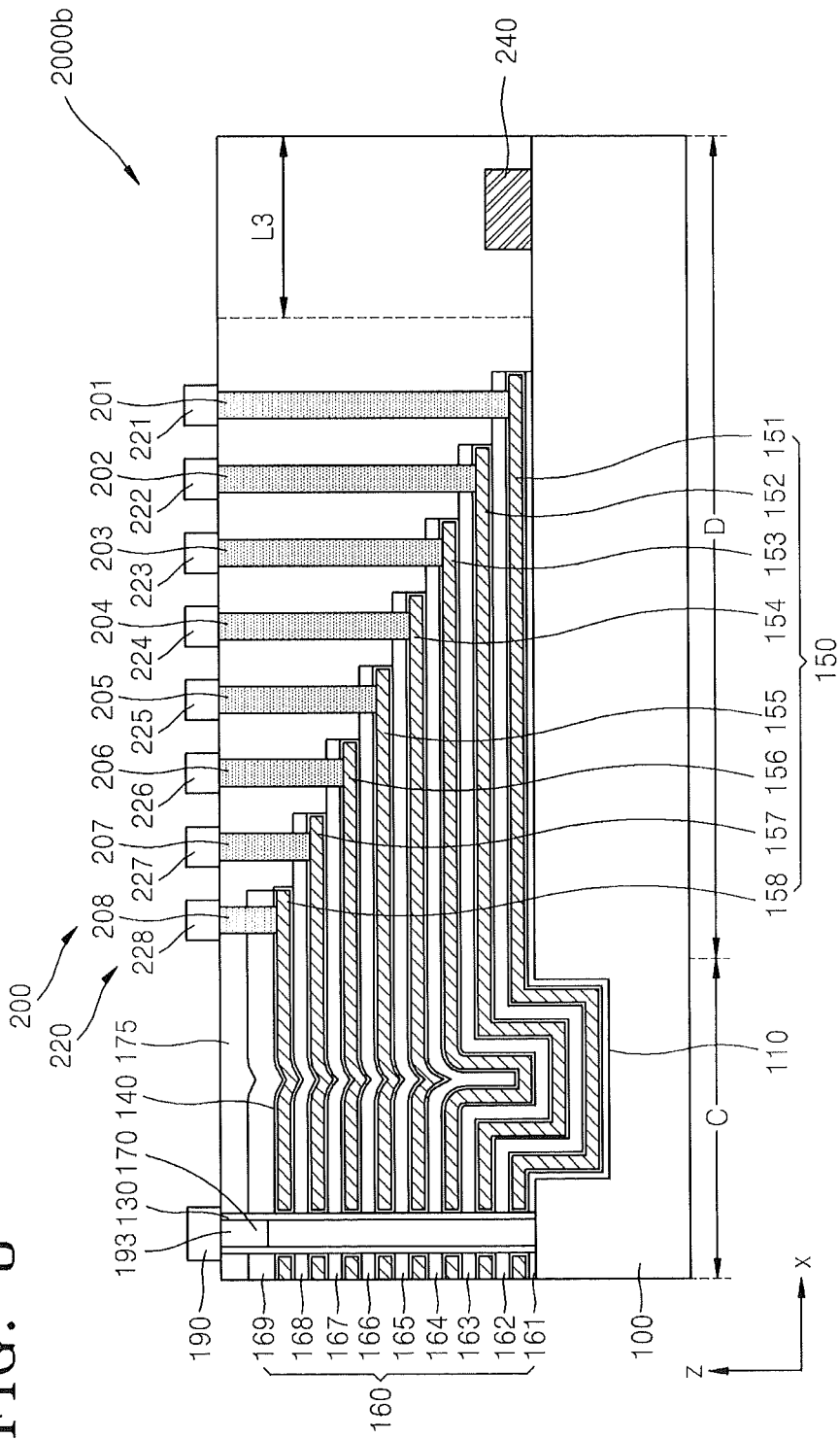
FIG. 8 is a cross-sectional view illustrating a structure of a nonvolatile memory device according to further embodiments of the inventive subject matter.

FIG. 8 is a cross-sectional view illustrating a structure of a nonvolatile memory device 2000b according to further embodiments of the inventive subject matter. In FIG. 8, features like those in FIGS. 4 through 5I are denoted by like reference numerals, and thus further detailed explanation thereof will not be given. Referring to FIG. 8, the nonvolatile memory device 2000b includes a dummy resistor 240 disposed on a side of the connection region D away from the cell array region C. The dummy resistor 240 may include, for example, polysilicon or a metal.

The dummy resistor 240 may be formed to have a structure similar to a resistor structure of the peripheral circuit region (not shown) is formed. The nonvolatile memory device 2000b may be formed in a similar process to the method of manufacturing the cell array region C, the connection region D, and the peripheral circuit region P described with reference to FIGS. 6A through 6C. In particular, the dummy resistor 240, instead of the second dummy trench 210, may be formed along with a resistor (not shown) of the peripheral circuit region P. In this case, when the peripheral circuit region P described with reference to FIG. 6B is formed, the mask layer 120 formed in the connection region D may be formed such that a region where the dummy resistor 240 is formed is further exposed by a predetermined length L3.

In FIG. 8, since the dummy resistor 240 is formed on an outer edge of the connection region D, the dummy resistor 240 may be used as a reference point for position measurement when stepped portions of terminal portions of the gate lines 150 are formed. Since the dummy resistor 240 that is one example of a dummy structure is formed along with resistors of the peripheral circuit region, a separate process is not necessary. Also, since the dummy resistor 240 is formed closer to the connection region D than components of the peripheral circuit region, measurement may be facilitated and a measurement error may be reduced.

Figure 9:
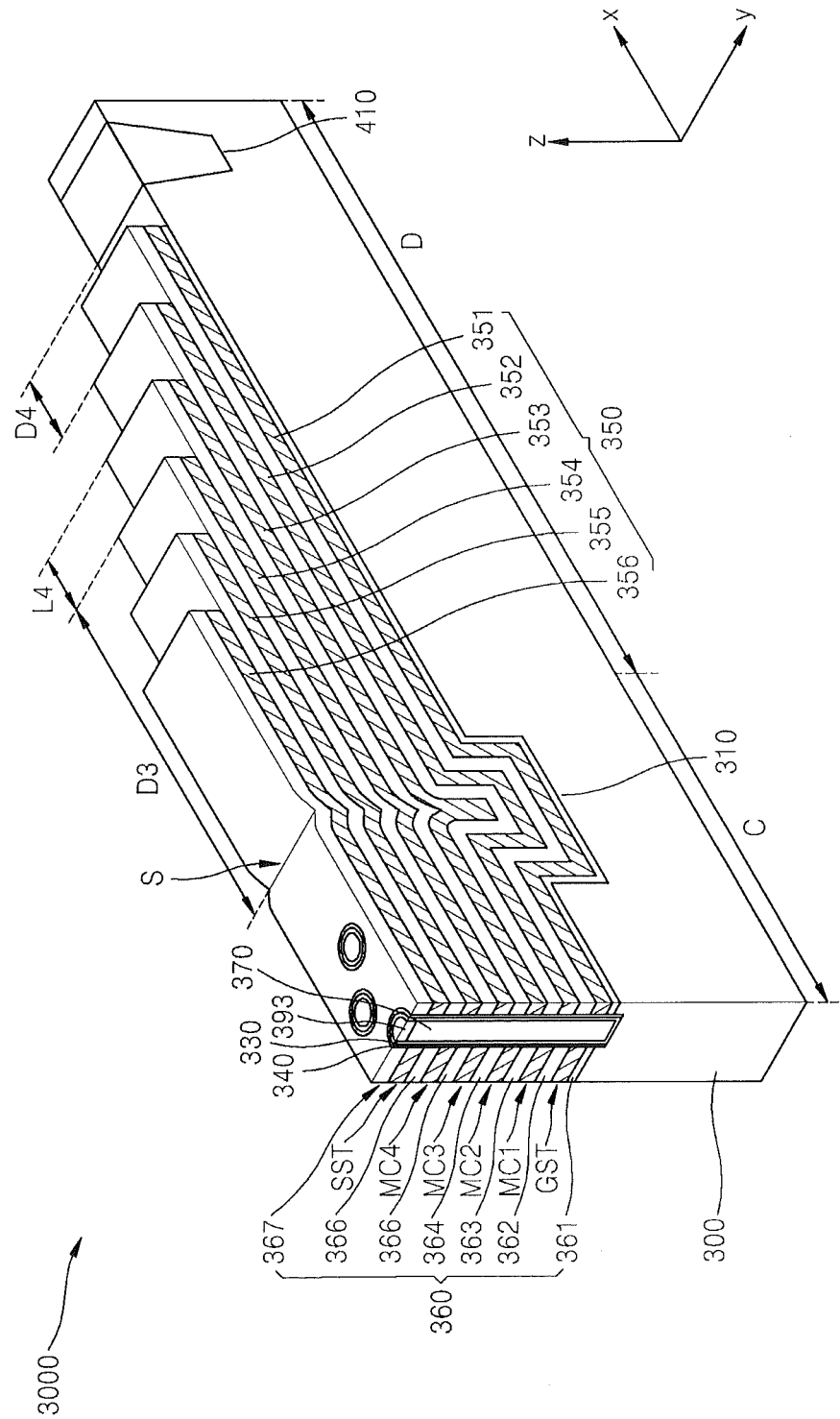
FIG. 9 is a perspective view illustrating a structure of a nonvolatile memory device according to a additional embodiments of the inventive subject matter.

FIG. 9 is a perspective view illustrating a structure of a nonvolatile memory device 3000 according to a additional embodiments of the inventive subject matter, illustrating a portion corresponding to line I-I' of FIG. 3. In FIG. 9, some of features constituting the memory cell strings of FIG. 1 may not be shown. For example, bit lines of the memory cell strings may not be shown.

Referring to FIG. 9, the nonvolatile memory device 3000 includes a cell array region C and a connection region D. The cell array region C includes channel regions 330 disposed on the substrate and a plurality of memory cell strings disposed along sidewalls of the channel regions 330. The plurality of memory cell strings may be arranged in an x direction around the channel regions 330 arranged in the x direction. With the structure shown in FIG. 9, memory cell strings similar to the memory cell strings 11 or 11A of FIGS. 1 and 2 extending in a z direction from the substrate 300 may be arranged along side surfaces of the channel regions 330. The memory cell strings may include one ground selection transistor GST, the plurality of memory cells MC1, MC2, MC3, and MC4, and one string selection transistor SST.

The substrate 300 may have a main surface extending in the x direction and a y direction. The substrate 300 may include a semiconductor material, for example, a group IV semiconductor, a group III-V compound semiconductor, or a group II-VI oxide semiconductor. The substrate 300 may be provided as a bulk wafer or an epitaxial layer.

A first dummy trench 310 may be located on the substrate 300 in the cell array region C adjacent to the connection region D. The first dummy trench 310 may extend in the y direction. The first dummy trench 310 may have a predetermined distance, for example, a distance of 10 μm or less, from at least one of terminal portions of gate lines 351 through 356 (collectively denoted by 350). Overlying the first dummy trench 310, the gate lines 350 may exhibit indentations due to the first dummy trench 310.

In FIG. 9, the indentations may have a curved shape recessed toward the first dummy trench 310. An indentation S is formed in the uppermost seventh interlayer insulating layer 367. The indentation S may be formed near a center of the first dummy trench 310. The indentation S may have a predetermined depth so as to be recognized as a reference point when being measured in a plane.

The channel regions 330 having pillar shapes may be disposed on the substrate 300 to extend in the z direction. The channel regions 330 may be spaced apart from one another in the x direction and the y direction, and may be disposed in a zigzag fashion in the x direction. The channel regions 330 may be formed in, for example, annular shapes. The channel regions 330 may be electrically connected to the substrate 300 such that bottom surfaces of the channel regions 330 directly contact the substrate 300. The channel regions 330 may include a semiconductor material, such as polysilicon or single crystal silicon, and the semiconductor material may not be doped or may include a p-type or an n-type impurity. Buried insulating layers 370 may be formed in the channel regions 330.

The string selection transistor SST disposed in the y direction may be commonly connected to the bit lines BL (see FIG. 1) through conductive layers 393. The bit lines (not shown) may have a pattern having a line shape extending in the y direction, and may be electrically connected through bit line contact plugs (not shown) formed in the conductive layers 393. Also, the ground selection transistor GST disposed in the y direction may be electrically connected to impurity regions (not shown) adjacent to the ground selection transistor GST.

The plurality of gate lines 150 may be arranged along the side surfaces of the channel regions 330 and spaced apart from the substrate 300 in the z direction. The gate lines 350 may be gates of the ground selection transistor GST, the plurality of memory cells MC1, MC2, MC3, and MC4, and the string selection transistor SST. The gate lines 350 may be commonly connected to adjacent memory cell strings arranged in the x direction. The gate line 356 of the string selection transistors SST may be connected to the string selection line SSL (see FIG. 1). The gate lines 352, 353, 354, and 355 of the memory cells MC1, M2, MC3, and MC4 may be connected to the word lines WL1, WL2, WLn-1, and WLn (see FIGS. 1 and 2). The gate line 351 of the ground selection transistors GST may be connected to the ground selection line GSL (see FIG. 1). The gate lines 350 may include a metal film, for example, tungsten (W). Also, although not shown in FIG. 9, the diffusion barrier layer may include any one selected from the group consisting of a tungsten nitride (WN), a tantalum nitride (TaN), and a titanium nitride (TiN).

Gate dielectric films 340 may be disposed between the channel regions 330 and the gate lines 350. Although not shown in FIG. 9, each of the gate dielectric films 340 may include a tunneling insulating layer, a charge storage layer, and a blocking insulating layer which are sequentially stacked from the channel regions 330.

The plurality of interlayer insulating layers 360 may be disposed between the gate lines 350. The interlayer insulating layers 360 may also be arranged to extend in the x direction and to be spaced apart from one another in the z direction, like the gate lines 350. One side surfaces of the interlayer insulating layers 360 may contact the channel regions 330. The interlayer insulating layers 360 may include a silicon oxide or a silicon nitride.

The connection region D is a region where the gate lines 350 and the interlayer insulating layers 360 extend, and includes stepped portions formed by the gate lines 350 and the interlayer insulating layers 360. The stepped portions may be formed such that the gate lines 350 and the interlayer insulating layers 360 which are upper layers are shorter by a predetermined length L4 than the gate lines 350 and the interlayer insulating layers 360 which are lower layers. The contact plugs 200 (see FIG. 3) for connecting the integrated word lines 220 (see FIG. 3) may be formed in the stepped portions.

A second dummy trench 410 is disposed on an outer edge of the connection region D. At a side of the connection region D opposite to a side of the connection region D contacting the cell array region C, the connection region D may contact a peripheral circuit region (not shown), and the second dummy trench 410 may be disposed adjacent to the peripheral circuit region. The second dummy trench 410 may be deeper than the first dummy trench 310, but the present embodiment is not limited thereto. Alternatively, the second dummy trench 410 may be formed in the peripheral circuit region (not shown) adjacent to the connection region D. In any case, the second dummy trench 410 may have a predetermined distance, for example, a distance of 10 µm or less, from at least one of the stepped portions, that is, the terminal portions of the gate lines 350.

The peripheral circuit region (not shown) may be disposed outside the connection region D in the x direction. Although not shown in FIG. 9, components, such as a high voltage transistor, a low voltage transistor, and a resistor, may be formed in the peripheral circuit region.

In FIG. 9, when the stepped portions of the gate lines 350 are formed, a stepped portion length may be measured by using the first dummy trench 310 and the second dummy trench 410 as reference points. As for the gate lines 350 close to the recessed portion S formed by the first dummy trench 310, a distance D3 from the recessed portion S may be measured by using the first dummy trench 310 as a reference point. Also, as for the gate lines 350 close to the second dummy trench 410, a distance D4 from the second dummy trench 310 may be measured by using the second dummy trench 410 as a reference point. Accordingly, the stepped portions may be formed at accurate positions of the terminal portions of the gate lines 350.

Figure 10:
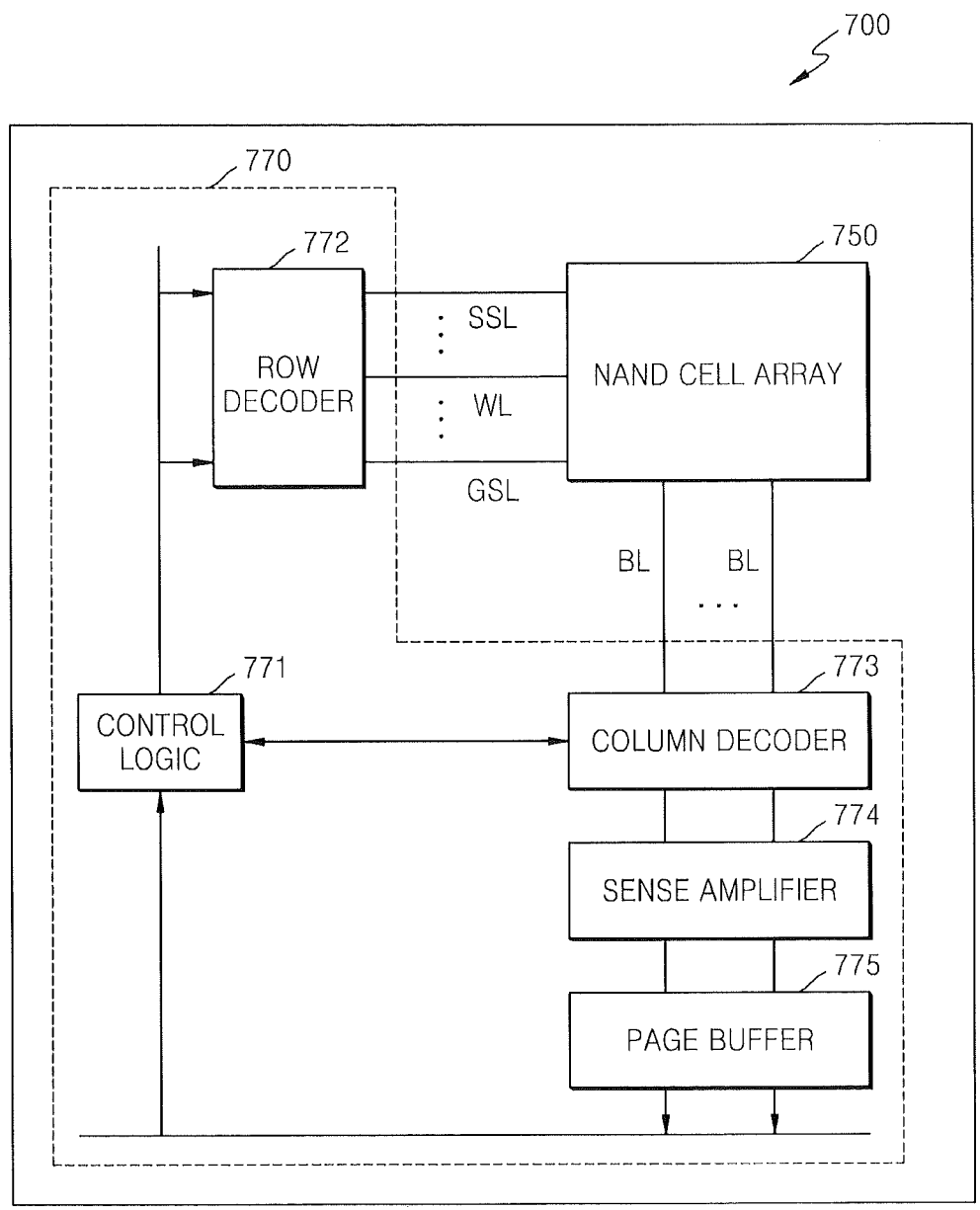
FIG. 10 is a block diagram of a nonvolatile memory device according to some embodiments of the inventive subject matter.

FIG. 10 is a block diagram of a nonvolatile memory device 700 according to some embodiments of the inventive subject matter. Referring to FIG. 10, in the nonvolatile memory device 700, a NAND cell array 750 may be coupled to a core circuit unit 770. For example, the NAND cell array 750 may include any one of the nonvolatile memory devices 1000, 2000a, 2000b, and 3000 respectively according to the above-described embodiments of the inventive subject matter. The core circuit unit 770 may include control logic 771, a row decoder 772, a column decoder 773, a sense amplifier 774, and a page buffer 775.

The control logic 771 may communicate with the row decoder 772, the column decoder 773, and the page buffer 775. The row decoder 772 may communicate with the NAND call array 750 through a plurality of string selection lines SSL, a plurality of word lines WL, and a plurality of ground selection lines GSL. The column decoder 773 may communicate with the NAND cell array 750 through a plurality of bit lines BL. The sense amplifier 774 may be connected to the column decoder 773 when a signal is output from the NAND cell array 750, and may not be connected to the column decoder 773 when a signal is transmitted to the NAND cell array 750.

For example, the control logic 771 may transmit a row address signal to the row decoder 772, and the row decoder 772 may decode the row address signal and transmit the row address signal to the NAND cell array 750 through the string selection lines SSL, the word lines WL, and the ground selection lines GSL. The control logic 771 may transmit a column address signal to the column decoder 773 or the page buffer 775, and the column decoder 773 may decode the column address signal and transmit the column address signal to the NAND cell array 750 through the plurality of bit lines BL. A signal of the NAND cell array 750 may be transmitted to the sense amplifier 774 through the column decoder 773, amplified by the sense amplifier 774, and transmitted to the control logic 771 through the page buffer 775.

While the inventive subject matter has been particularly shown and described with reference to exemplary embodiments thereof, it will be understood that various changes in form and details may be made therein without departing from the spirit and scope of the following claims.

What is claimed is:

1. A memory device comprising:
   a substrate having a defined cell array region;
   a dummy pattern disposed on the substrate near an edge of the cell array region; and
   a plurality of vertically stacked conductive lines on the substrate, covering the dummy pattern and having a surface variation at a crossing of the dummy pattern that indicates a position of the underlying dummy pattern.

2. The memory device of claim 1, wherein the dummy pattern comprises a trench.

3. The memory device of claim 1, wherein the substrate further comprises a connection region disposed adjacent the cell array region and a peripheral circuit region disposed adjacent the connection region on a side thereof opposite the cell array region, wherein circuits for driving a cell array are disposed in the peripheral circuit region, and wherein the plurality of conductive lines are connected to the circuits of the peripheral circuit region by wiring lines in the connection region.

4. The memory device of claim 3, wherein the conductive lines have a stepped structure in the connection region.

5. The memory device of claim 4, further comprising a plurality of contact plugs in the connection region, respective ones of which contact respective terminations of the conductive lines.

6. The memory device of claim 1, when the dummy pattern comprises a first dummy pattern, the vertical nonvolatile memory device further comprises at least one second dummy pattern disposed in the connection region adjacent the peripheral circuit region which is configured as a reference point for measuring locations of terminations of the conductive lines.

7. The memory device of claim 6, wherein the at least one second dummy pattern has the same structure as a structure formed in the peripheral circuit region.

8. The memory device of claim 6, wherein the first dummy pattern and the second dummy pattern are electrically isolated.

9. The memory device of claim 1, further comprising a plurality of spaced apart memory cell strings extending vertically from the substrate and comprising respective spaced apart channel regions extending vertically from the substrate in the cell array region and controlled by the plurality of conductive lines.

10. The memory device of claim 9, wherein the plurality of conductive lines serve as gate lines of transistors of the memory cell strings.

11. A memory device comprising:
    a substrate;
    a dummy structure on or in the substrate near a boundary of a connection region of the substrate;
    a vertical channel region disposed on the substrate in a cell array region of the substrate; and
    a plurality of vertically stacked conductive gate lines with insulating layers interposed therebetween, the conductive gate lines and interposed insulating layers disposed laterally adjacent the vertical channel region and extending across the dummy structure, at least an uppermost one of the conductive gate lines and insulating layers having a surface variation at the crossing of the dummy structure configured to serve as a reference feature.

12. The memory device of claim 11, wherein the dummy structure comprises a trench and wherein the surface variation comprises an indentation overlying the trench.

13. The memory device of claim 11, wherein terminations of the conductive gate lines are stepped.

14. The memory device of claim 13, further comprising a second dummy structure disposed near an edge of the connection region opposite the cell array region.

15. The memory device of claim 14, wherein the second dummy structure comprises a dummy trench, a dummy resistor or a dummy gate structure.

* * * * *